United States Patent
Sugimoto

(10) Patent No.: US 10,454,011 B2
(45) Date of Patent: Oct. 22, 2019

(54) MALFUNCTION DETECTION DEVICE FOR POWER GENERATOR

(71) Applicant: Toyota Jidosha Kabushiki Kaisha, Toyota-shi, Aichi-ken (JP)

(72) Inventor: Kazuhiro Sugimoto, Susono (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 171 days.

(21) Appl. No.: 15/863,224

(22) Filed: Jan. 5, 2018

(65) Prior Publication Data

US 2018/0198048 A1 Jul. 12, 2018

(30) Foreign Application Priority Data

Jan. 10, 2017 (JP) .................... 2017-001986

(51) Int. Cl.
| | |
|---|---|
| *H01L 35/30* | (2006.01) |
| *H01L 35/02* | (2006.01) |
| *H02N 11/00* | (2006.01) |
| *H01L 35/00* | (2006.01) |

(52) U.S. Cl.
CPC .............. *H01L 35/02* (2013.01); *H01L 35/00* (2013.01); *H02N 11/002* (2013.01); *H02N 11/008* (2013.01)

(58) Field of Classification Search
CPC .......................... H01L 35/00–34; H01L 27/16
USPC .................................................. 136/200–242
See application file for complete search history.

(56) References Cited

U.S. PATENT DOCUMENTS

| | | |
|---|---|---|
| 2017/0211450 A1 | 7/2017 | Sugimoto |
| 2017/0213948 A1 | 7/2017 | Sugimoto |
| 2017/0213949 A1 | 7/2017 | Sugimoto |
| 2017/0213952 A1 | 7/2017 | Sugimoto |

FOREIGN PATENT DOCUMENTS

| | | | |
|---|---|---|---|
| JP | 2005117836 | * | 4/2005 |
| JP | 2008223504 | * | 9/2008 |
| JP | 2017-135152 A | | 8/2017 |
| JP | 2017-135157 A | | 8/2017 |
| JP | 2017-135160 A | | 8/2017 |
| JP | 2017-135777 A | | 8/2017 |
| WO | 2015/125823 A1 | | 8/2015 |

* cited by examiner

Primary Examiner — Bach T Dinh
(74) Attorney, Agent, or Firm — Dinsmore & Shohl LLP

(57) ABSTRACT

A malfunction detection device is provided for a power generator that includes a thermoelectric transducer module including, as a plurality of thermoelectric transducers, a plurality of semiconductor single crystals in which the band gap energy of an intrinsic semiconductor part is lower than the band gap energies of an n-type semiconductor part and a p-type semiconductor part. The malfunction detection device performs a malfunction detection of the power generator on a transducer-to-transducer basis. According to this malfunction detection process, the temperatures at three points of the thermoelectric transducer are detected or estimated. An estimated electromotive voltage is calculated on the basis of the temperatures at three points that are defected or estimated. A malfunction of the power generator is detected when the absolute value of the difference between the estimated electromotive voltage and an actual electromotive voltage is greater than or equal to a threshold value.

7 Claims, 13 Drawing Sheets

MALFUNCTION DETECTION DEVICE FOR POWER GENERATOR

CROSS-REFERENCE TO RELATED APPLICATION

This application is based on and claims the benefit of Japanese Patent Application No. 2017-001986, filed on Jan. 10, 2017, which is incorporated by reference herein in its entirety.

BACKGROUND

Technical Field

The present disclosure relates to a malfunction detection device for a power generator, and more particularly to a malfunction detection device for a power generator that includes, as a thermoelectric transducer, a semiconductor single crystal that can transduce heat into electric power even in a uniform temperature field.

Background Art

There are various thermoelectric transducers based on the Seebeck effect. For such a thermoelectric transducer to produce an electromotive voltage, there needs to be a temperature difference between the two kinds of metals or semiconductors foiling the thermoelectric transducer. On the other hand, WO 2015125023 A1 discloses a semiconductor single crystal that can be used as a thermoelectric transducer capable of generating power without the temperature difference. In detail, this semiconductor single crystal includes an n-type semiconductor part, a p-type semiconductor part, and an intrinsic semiconductor past disposed between the B-type semiconductor part and the p-type semiconductor part, and the band gap energy of the Intrinsic semiconductor part is set to be lower than the respective band gap energies of the n-type semiconductor part and the p-type semiconductor part.

WO 2015125823 A1 is a patent document which may be related to the present disclosure.

SUMMARY

When the semiconductor single crystal disclosed in WO 2015125823 A1 is used as a thermoelectric transducer, it is favorable that malfunction of a power generator that includes the thermoelectric transducer can be accurately detected.

The present disclosure has been made to address the problem described above, and an object of the present disclosure is to provide a malfunction detection device for a power generator which includes a thermoelectric transducer that does not require a temperature difference for power generation (that is, a semiconductor single crystal configured such that the band gap energy of an intrinsic semiconductor part disposed between an n-type semiconductor part and a p-type semiconductor part is lower than the respective hand gap energies of the n-type semiconductor part and the p-type semiconductor part), and which can accurately detect a malfunction of the power generator.

A malfunction detection device for a power generator according to the present disclosure is configured to perform a malfunction detection of a power generator that includes:

a thermoelectric transducer module that is arranged at a portion to which exhaust heat from a heat generating apparatus is transferred, and that includes, as at least one thermoelectric transducer, at least one semiconductor single crystal including an n-type semiconductor part, a p-type semiconductor part and an intrinsic semiconductor part located between the n-type semiconductor part and the p-type semiconductor part, a band gap energy of the intrinsic semiconductor part being lower than respective band gap energies of the n-type semiconductor part and the p-type semiconductor part; and a load device that is included in an electric circuit along with the thermoelectric transducer module.

The malfunction detection device performs the malfunction detection for at least one of the at least one thermoelectric transducer on a transducer basis, or performs the malfunction detection for the whole thermoelectric transducer module on the module basis.

The malfunction detection device comprises a processor
the processor being programmed to:

detect or estimate, using one or more temperature sensors, an n-type end portion temperature that is a temperature of an end portion of the n-type semiconductor part on an opposite side to the intrinsic semiconductor part a p-type end portion temperature that is a temperature of an end portion of the p-type semiconductor part on an opposite side to the intrinsic semiconductor part, and an intrinsic portion temperature that is a temperature of the intrinsic semiconductor part, with respect to one or a plurality of thermoelectric transducers that are subject to the malfunction detection;

calculate at least one of an estimated electromotive voltage and an estimated generated electric power based on the estimated electromotive voltage on the transducer basis or the module basis, based on the n-type end portion temperature, the p-type end portion temperature and the intrinsic portion temperature that are detected or estimated;

detect, using one or more sensors, at least one of an actual electromotive voltage and an actual generated electric power on the transducer basis or the module basis; and perform, on the transducer basis or the module basis, at least one of a first determination as to whether or not a degree of deviation of the actual electromotive voltage with respect to the estimated electromotive voltage is greater than or equal to a first threshold value, and a second determination as to whether or not a degree of deviation of the actual generated electric power with respect to the estimated generated electric power is greater than or equal to a second threshold value, and to detect a malfunction of the power generator in response to a result of at least one of the first determination and the second determination being positive.

The thermoelectric transducer module may be arranged at a surface of a heat supplier that transfers exhaust heat from the heat generating apparatus.

The at least one thermoelectric transducer may include one set of thermoelectric transducers, that are arranged in a row on the surface of the heat supplier.

The one or more temperature sensors may include a plurality of temperature sensors whose number are less than a total number of the n-type end portion temperature, the p-type end portion temperature and the intrinsic portion temperature of the one set of thermoelectric transducers, and which are attached to the heat supplier in such a manner as to be spaced by a predetermined distance from each other and be arranged along a direction parallel to the row.

The processor may be programmed to estimate each n-type end portion temperature, each p-type end portion temperature and each intrinsic portion temperature of the one set of thermoelectric transducers, based on a temperature distribution of the one set of thermoelectric transducers based on detection values of the plurality of temperature sensors.

The portion to which exhaust heat from the heat generating apparatus is transferred may be a flow channel through which an exhaust heat recovery fluid that recovers exhaust heat from the heat generating apparatus flows.

The thermoelectric transducer module may include a flow channel formation member that zones the flow channel such that a plurality of unit flow channels through which the exhaust heat recovery fluid flows in parallel are formed.

The flow channel formation member may have a thermal conductivity that is lower than a thermal conductivity of the at least one thermoelectric transducer of the thermoelectric transducer module.

The at least one thermoelectric transducer of the thermoelectric transducer module may include plural sets of thermoelectric transducers, each set of which has a plurality of thermoelectric transducers that are arranged so as to be along a direction perpendicular to an extension direction of the plurality of unit flow channels and to across the plurality of unit flow channels.

Each thermoelectric transducer of the plural sets of thermoelectric transducers may be covered by the flow channel formation member while a surface of the intrinsic semiconductor part of the each thermoelectric transducer is exposed to the exhaust heat recovery fluid.

The one or more temperature sensors may include:

a plurality of intrinsic portion temperature sensors configured to detect temperatures of respective intrinsic semiconductor parts of a part of thermoelectric transducers of a plurality of thermoelectric transducers located in each unit flow channel of the plurality of unit flow channels; and one or a plurality of end portion temperature sensors that are arranged at the flow channel formation member.

The processor may be programmed to:

detect or estimate, for each unit flow channel, each intrinsic portion temperature of the plural sets of thermoelectric transducers, based on detection values of the plurality of intrinsic portion temperature sensors; and detect or estimate each n-type end portion temperature and each p-type end portion temperature of the plural sets of thermoelectric transducers, based on detection values of the one or a plurality of end portion temperature sensors.

The plurality of intrinsic portion temperature sensors may be distributed one by one to the plurality of unit flow channels and are attached to each thermoelectric transducer of a set of thermoelectric transducers located on a most downstream side of the plurality of unit flow channels, of the plural sets of thermoelectric transducers.

The malfunction detection device further may comprise a temperature adjuster configured to perform heating or cooling of the flow channel formation member to adjust a temperature of the one or a plurality of end portion temperature sensors within a temperature range in which one or a plurality of thermoelectric transducers that are subject to the malfunction detection are able to generate an electromotive voltage.

The processor may be programmed to:

after detecting the malfunction of the power generator in response to a result of at least one of the first determination and the second determination being positive, perform the heating or the cooling by the temperature adjuster in a condition in which there is no flow of the exhaust heat recovery fluid and in which a temperature of the exhaust heat recovery fluid is stable;

in response to the actual electromotive voltage deviating from an electromotive voltage estimation range of the one or a plurality of thermoelectric transducers in a temperature adjustment state in which the heating or the cooling by the temperature adjuster is performed or in response to the actual generated electric power deviating from a generated electric power estimation range of the one or a plurality of thermoelectric transducers in the temperature adjustment state, determine that the malfunction of the power generator is caused by a malfunction of the thermoelectric transducer module; and in response to the actual electromotive voltage falling within the electromotive voltage estimation range or in response to the actual generated electric power falling within the generated electric power estimation range, determine that the malfunction of the power generator is caused by a malfunction of the flow channel.

The processor may be programmed, in response to at least one of detection values of the plurality of intrinsic portion temperature sensors deviating in the temperature adjustment stare from an allowable range according to a heat input amount by the heating or a heat release amount by the cooling by the temperature adjuster, to determine that a malfunction concerning detection of the intrinsic portion temperature has occurred.

The processor may be programmed, in response to at least one of detection values of the one or a plurality of end portion temperature sensors deviating in the temperature adjustment state from an allowable range according to a heat input amount by the heating or a heat release amount by the cooling by the temperature adjuster, to determine that a malfunction concerning detection of the n-type end portion temperature or the p-type end portion temperature has occurred.

According to the malfunction detection device for the power generator of the present disclosure, a semiconductor single crystal configured such that the band gap energy of an intrinsic semiconductor part disposed between an n-type semiconductor part and a p-type semiconductor part is lower than the respective band gap energies of the n-type semiconductor part and the p-type semiconductor part is used as a thermoelectric transducer. According to the thermoelectric transducer having this kind of structure, in contrast to a thermoelectric transducer using the Seebeck effect, an electromotive voltage can be produced even if there is no temperature difference between the both ends of the thermoelectric transducer. Thus, in order to calculate an estimated electromotive voltage of the thermoelectric transducer according to the present disclosure on the basis of the temperature of the thermoelectric transducer, it is not good enough to only obtain the temperatures at the both ends of the thermoelectric transducer. In this regard, according to the malfunction detection device of the present disclosure, at least one of the estimated electromotive voltage and an estimated generated electric power based on the estimated electromotive voltage is calculated on a transducer basis or a module basis, based on the temperatures at the both ends of the thermoelectric transducer (that is, the n-type end portion temperature and the p-type end portion temperature) and the temperature of the intrinsic semiconductor part (that is, the intrinsic portion temperature) that are detected or estimated. Then, at least one of the first determination as to whether or not the degree of deviation of the actual electromotive voltage with respect to the estimated electromotive voltage is greater than or equal to the first threshold value, and the second determination as to whether or not the degree of deviation of the actual generated electric power with respect to the estimated generated electric power is greater than or equal to the second threshold value is performed on the transducer basis or the module basis. In response to the result of at least one of the first determination and the second determination being positive, a malfunction of the power generator is detected. As just described, according to the malfunction detection device of the present disclosure using the temperatures at three points described above, a malfunction of the power generator that includes at least one thermoelectric transducers in which the temperature difference is not required for the generation of electric power can be detected accurately.

DETAILED DESCRIPTION

In the following, embodiments of the present disclosure are described with reference to the accompanying drawings. However, it is to be understood that, even when the number, quantity, amount, range or other numerical attribute of an element is mentioned in the following description of the embodiments, the present disclosure is not limited to the mentioned numerical attribute unless explicitly described otherwise, or unless the present disclosure is explicitly specified by the numerical attribute theoretically. Further, structures or steps or the like that are described in conjunction with the following embodiments are not necessarily essential to the present disclosure unless explicitly shown otherwise, or unless the present disclosure is explicitly specified by the structures, steps or the like theoretically.

First Embodiment

First, with reference to FIGS. 1 to 9, a first embodiment according to the present disclosure will be described.
[Configuration of Thermoelectric Transducer]

Figure 3:
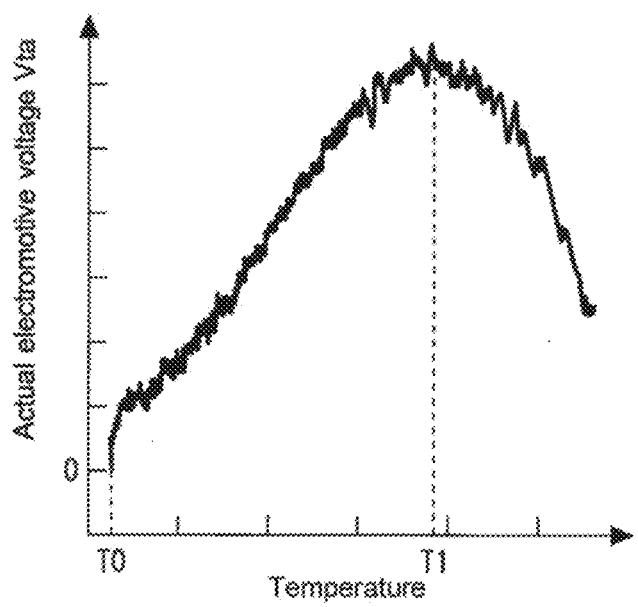
FIG. 3 is a graph that illustrates a relation between an actual electromotive voltage Vta and the temperature of the thermoelectric transducer.

FIG. 3 is a schematic perspective view that illustrates a configuration of each thermoelectric transducer 12 of a power generator 10 (see FIG. 4 described later) according to the first embodiment of the present disclosure. In the example shown in FIG. 1, the thermoelectric transducer 12 has the shape of a prism. The thermoelectric transducer 12 has an n-type semiconductor part 12a at one end and a p-type semiconductor part 12b at the other end. The thermoelectric transducer 12 further has an intrinsic semiconductor part 12c between the n-type semiconductor part 12a and the p-type semiconductor part 12b.

Figure 1:
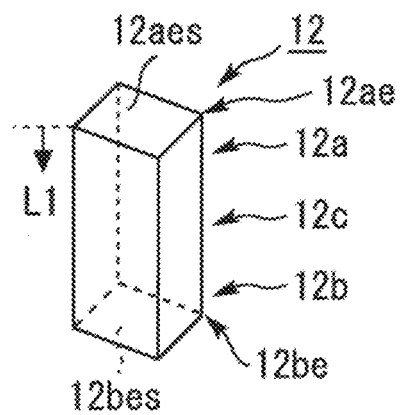
FIG. 1 is a schematic perspective view that illustrates a configuration of each thermoelectric transducer of a power generator according to a first embodiment of the present disclosure.
Figure 2A:
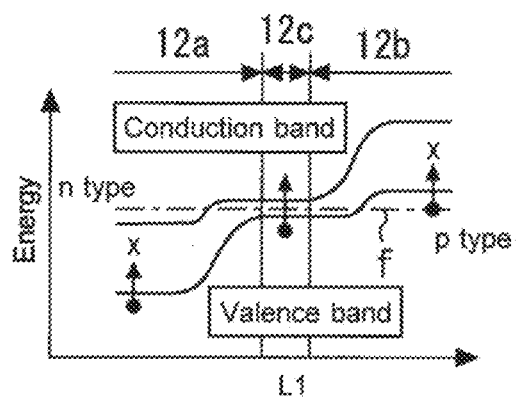
FIG. 2A is a conceptual diagram showing a status of thermal excitation of the thermoelectric transducer 12 of FIG. 1 when heated to a predetermined temperature.
Figure 2B:
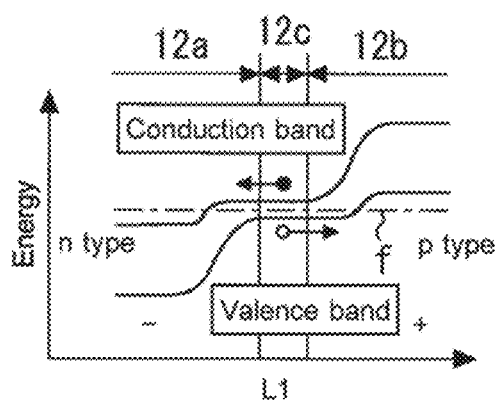
FIG. 2B is a conceptual diagram showing movement of an electron and a hole when the thermoelectric transducer 12 of FIG. 1 is heated to the predetermined temperature.

FIGS. 2A and 2B are conceptual, diagrams showing statuses of the band gap energy of the thermoelectric transducer 12 shown in FIG. 1. In FIGS. 2A and 2B, the vertical axes indicate the energy of an electron, and the horizontal axes indicate the distance L1 (see FIG. 1) from an end face 12aes of the thermoelectric transducer 12 on the side of the n-type semiconductor part 12a (that is, an end face of the n-type semiconductor part 12a on the side opposite to the intrinsic semiconductor part 12c). The other end face 12bes is an end face of the p-type semiconductor part 12b on the opposite side to the intrinsic semiconductor part 12c.

As shown in FIGS. 2A and 2B, in the n-type semiconductor part 12a, the Fermi level f is in the conduction band, and in the p-type semiconductor part 12b, the Fermi level f is in the valence band. In the intrinsic semiconductor part 12c, the Fermi level f is at the middle of the forbidden band existing between the conduction band and the valence band. The band gap energy corresponds to the difference in energy between the uppermost part of the valence band and the lowermost part of the conduction band. As can be seen from these drawings, the band gap energy of the intrinsic semiconductor part 12c of the thermoelectric transducer 12 is lower than the respective band gap energies of the n-type semiconductor part 12a and the p-type semiconductor part 12b. Note that the length ratio between the n-type semiconductor part 12a, the p-type semiconductor part 12b and the intrinsic semiconductor part 12c shown in FIGS. 2A and 2B is just an example, and the ratio can vary depending on how the thermoelectric transducer (semiconductor single crystal) 12 is formed. The band gap energy of the n-type semiconductor part 12a, the p-type semiconductor part 12b and the intrinsic semiconductor part 12c can be measured in inverse photoelectron spectroscopy, for example.

The thermoelectric transducer (semiconductor single crystal) 12 having the characteristics described above (that is, the band gap energy of the intrinsic semiconductor part 12c is lower than the respective band gap energies of the n-type semiconductor part 12a and the p-type semiconductor part 12b) can be made of a clathrate compound (inclusion compound), for example. As an example of the clathrate compound, a silicon clathrate $Ba_8Au_8Si_{38}$ may be used.

The thermoelectric transducer 12 according to the present embodiment can be manufactured in any method, as far as the method can produce the thermoelectric transducer 12 having the characteristics-described above. If the thermoelectric transducer 12 is made of, for example, the silicon clathrate $Ba_8Au_8Si_{38}$, the manufacturing method described in detail in International Publication No. WO 2015125823 A1 can be used, for example. The manufacturing method can be summarized as follows. That is, Ba powder, An powder and Si powder are weighed in the ratio (molar ratio) of 8:8:38. The weighed powders are melted together by arc melting. The melt is then cooled to form an ingot of the silicon clathrate $Ba_8Au_8Si_{38}$. The ingot of the silicon clathrate $Ba_8Au_8Si_{38}$ prepared in this way is crushed into grains. The grains of the silicon clathrate $Ba_8Au_8Si_{38}$ are melted in a crucible in the Czochralski method, thereby forming a single crystal of the silicon clathrate $Ba_8Au_8Si_{38}$. The thermoelectric transducer 12 shown in FIG. 1 is provided by cutting the single crystal of the silicon clathrate $Ba_8Au_8Si_{38}$ prepared in this way into the shape of a prism (more specifically, the shape of a rectangular parallelepiped). The shape of the thermoelectric transducer is not limited to the prism, and the thermoelectric transducer may have any shape provided by cutting the single crystal into a desired shape, such as a cube or a column. For example, the thermoelectric transducer may be formed in such a flat plate shape that the n-type semiconductor part 12a, the intrinsic semiconductor part 12c and the p-type semiconductor part 12b are thinly stacked.

[Principle of Power Generation]

FIG. 2A is a conceptual diagram showing a status of thermal excitation of the thermoelectric transducer 12 when the thermoelectric transducer 12 is heated to a predetermined temperature. If the thermoelectric transducer 12 is heated to a temperature T0 (see FIG. 3 described later) or higher, electrons (shown by black dots) in the valence hand are thermally exerted into the conduction band, as shown in FIG. 2A. More specifically, if heat is supplied and energy exceeding the band gap energy is thereby supplied to an electron located in an uppermost part of the valence band, the electron is excited into the conduction band. In the process where the temperature of the thermoelectric transducer 12 increases, a condition can occur in which such thermal excitation of electrons occurs only in the intrinsic semiconductor past 12c, which has a relatively low hand gap energy. FIG. 2A shows a status of the thermoelectric transducer 12 in which the thermoelectric transducer 12 is heated to a predetermined temperature (such as the temperature T0) that can allow such a condition to occur. In this status, no electrons are thermally excited, in the n-type semiconductor part 12a and the p-type semiconductor part 12b, which have a relatively higher band gap energy.

FIG. 2B is a conceptual diagram showing movement of an electron (shown by the black dot) and a hole (shown by a white dot) when the thermoelectric transducer 12 is heated to the predetermined temperature described above. As shown in FIG. 2B, electrons excited into the conduction band move toward a part of lower energy, that is, toward the n-type semiconductor part 12a. On the other hand, holes formed in the valence band as a result of the electrons being excited move toward a part of higher energy, that is, toward the p-type semiconductor part 12b. The carriers are unevenly distributed in this way, so that the n-type semiconductor part 12a is negatively charged, and the p-type semiconductor part 12b is positively charged, and therefore, an electromotive force occurs between the n-type semiconductor part 12a and the p-type semiconductor part 12b. Thus, the thermoelectric transducer 12 can generate power even if there is no temperature difference between the n-type semiconductor part 12a and the p-type semiconductor part 12b. This principle of power generation differs from the Seebeck effect, which produces an electromotive force based on a temperature difference.

FIG. 3 is a graph that illustrates a relation between an actual electromotive voltage Vta and the temperature of the thermoelectric transducer 12. The term "actual electromotive voltage Vta" of the thermoelectric transducer 12 used herein refers to a detection value of electromotive voltage (that is, electromotive force) Vt that is the potential difference produced, when no electric current flows in the thermoelectric transducer 12, between an end portion of the thermoelectric transducer 12 on the side of the p-type semiconductor part 12b serving as a positive electrode and an end portion of the thermoelectric transducer 12 on the side of the n-type semiconductor part 12a serving as a negative electrode. More specifically, the relation shown in FIG. 3 shows temperature characteristics of the electromotive voltage produced when the thermoelectric transducer 12 is heated in such a manner that no temperature difference is produced between the n-type semiconductor part 12a and the p-type semiconductor part 12b. Note that the temperature range in which the actual electromotive voltage Vta is produced differs depending on the composition of the thermoelectric transducer.

As shown in FIG. 3, the actual electromotive voltage Vta is produced when the thermoelectric transducer 12 is heated to the temperature T0 or higher. More specifically, as the temperature of the thermoelectric transducer 12 increases, the actual electromotive voltage Vta also increases. As can be seen from this correlation, the electromotive voltage of the thermoelectric transducer 12 depends on its temperature. A possible reason why the actual electromotive voltage Vta increases as the temperature increases as shown in FIG. 3 is that, as the amount of heat supplied increases, the number of electrons and holes that can be excited in the intrinsic semiconductor part 12c, which has a relatively low band gap energy, increases. As shown in FIG. 3, the actual electromotive voltage Vta reaches a peak value at a certain temperature T1 and decreases as the thermoelectric transducer 12 is further heated beyond the temperature T1. A possible reason for this is that, as the temperature of the thermoelectric transducer 12 increases, not only electrons and holes in the intrinsic semiconductor part 12c but also electrons and holes in the n-type semiconductor part 12a and the p-type semiconductor part 12b are thermally excited.

[Portion to Which Thermoelectric Transducer Module According to First Embodiment Applied]

When the thermoelectric transducer 12 having the configuration described above is arranged at a portion to which exhaust heat from a heat generating apparatus is transferred, power generation can be performed. However, the thermoelectric transducer 12 is not used alone when it is arranged at the portion. The thermoelectric transducer 12 constitutes a thermoelectric transducer module with other parts (for example, an electrode) and is used in the form of the thermoelectric transducer module. Because of this, the thermoelectric transducer module as used herein means an assembly of the semiconductor single crystal and parts (for example, an electrode) to functionalize the semiconductor single crystal as the thermoelectric transducer.

Figure 4:
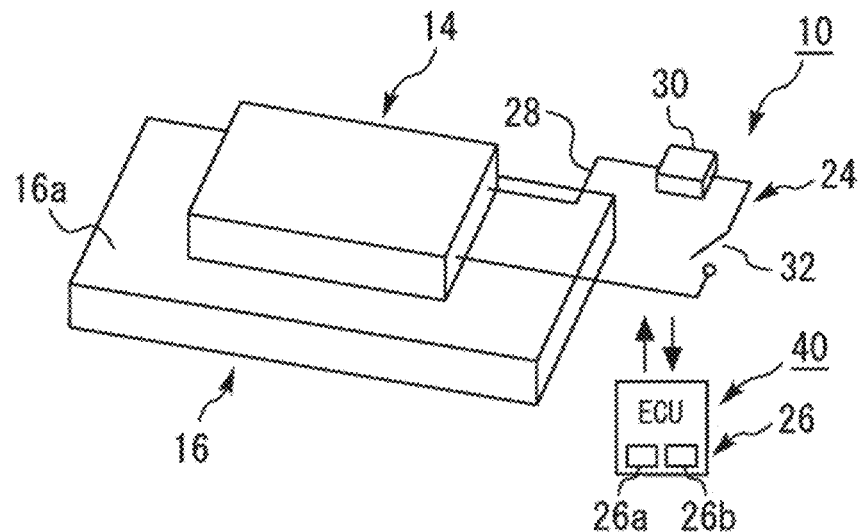
FIG. 4 is a schematic diagram that illustrates a configuration of a thermoelectric transducer module of the power generator according to the first embodiment of the present disclosure.

FIG. 4 is a schematic diagram that illustrates a configuration of a thermoelectric transducer module 14 of the power generator 10 according to the first embodiment of the present disclosure. As an example, the thermoelectric transducer module 14 according to the present embodiment is applied to a vehicle that includes an internal combustion engine. In the present embodiment, the internal combustion engine corresponds to the "heat generating apparatus" described above. In more detail the internal combustion engine is one of the heat generating apparatuses that generate heat when they operate.

To be more specific, the thermoelectric transducer module 14 is installed on an outer surface 16a of an exhaust pipe 16 of the internal combustion engine as shown in FIG. 4. The heat that is transferred from the inside of the exhaust pipe 16 to the outside by heat conduction is absorbed in the thermoelectric transducer module 14 installed on the outer surface 16a, and is transduced into electric power by the thermoelectric transducer module 14. That is, according to the thermoelectric transducer module 14, the exhaust heat from the internal combustion engine that is a heat generating apparatus can be recovered as the electric power. In addition, the portion to which the thermoelectric transducer module according to the present disclosure is applied is not particularly limited, as far as it is a portion to which exhaust heat from a heat generating apparatus is transferred. In more detail, if the thermoelectric transducer module 14 is applied to a vehicle as an example, the thermoelectric transducer module 14 may be provided for a heat generating apparatus that generates heat during operation, such as a transmission, a battery or a brake system, instead of the internal combustion engine. Moreover, as in sixth and seventh embodiments described later, the thermoelectric transducer module 14 may also be installed in a flow channel through which an exhaust heat recover fluid that has recovered the exhaust heat from a heat generating apparatus flows.

[Configuration of Thermoelectric Transducer Module]

Figure 5:
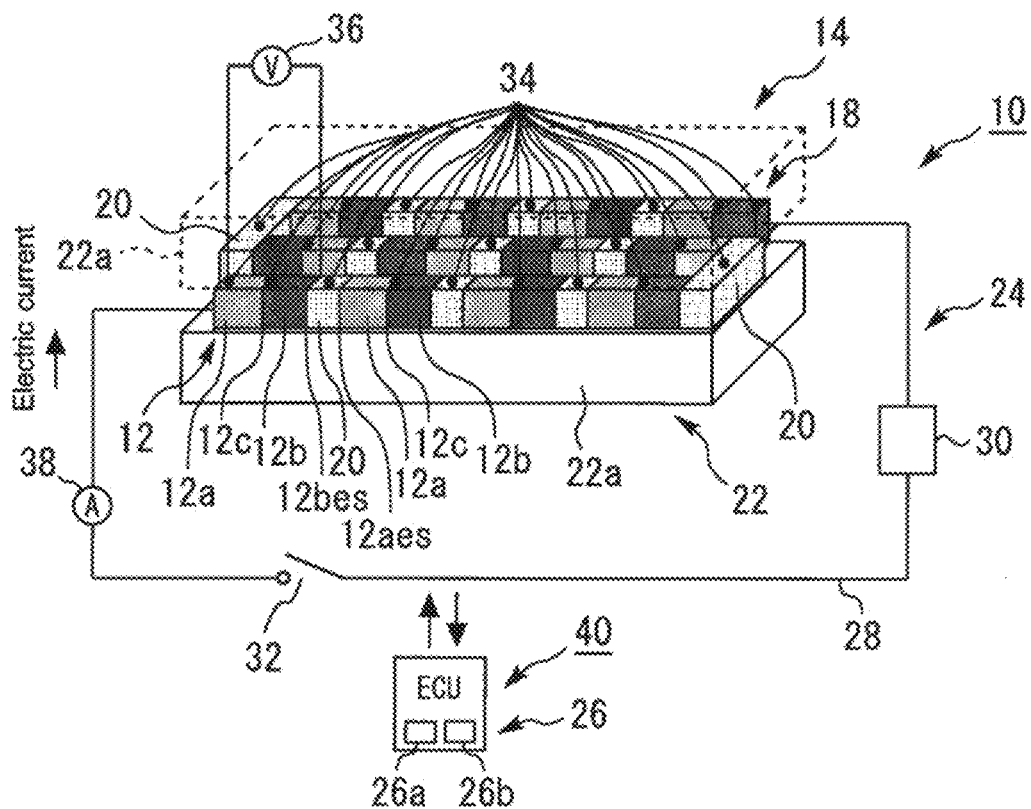
FIG. 5 is a partial perspective diagram that schematically illustrates an internal structure of the thermoelectric transducer module shown in FIG. 4.

FIG. 5 is a partial perspective diagram that schematically illustrates an internal structure of the thermoelectric transducer module 14 shown in FIG. 4. In addition. In FIG. 5, for the sake of clarity of the arrangement of the thermoelectric transducers 12, the n-type semiconductor part 12a and the p-type semiconductor part 12b of the thermoelectric transducer 12 are distinguished by color. The intrinsic semiconductor part 12c lies between the n-type semiconductor part 12a and the p-type semiconductor part 12b that are distinguished by color. This also applies to FIGS. 14, 16, 17 and 20 described later.

As shown in FIG. 5, the thermoelectric transducer module 14 is provided with a plurality of thermoelectric transducers 12, More specifically, the thermoelectric transducer module 14 is provided with a transducer stack 18 that is a stack of the plurality of thermoelectric transducers 12. In the transducer stack 18, adjacent thermoelectric transducers 12 are connected in series with each other with an electrode 20 interposed therebetween. The electrodes 20 may be made of a metal material, such as copper, that has low electrical resistance. In more detail, in order to ensure that the electric current smoothly flows while maximizing the potential difference between the electrodes 20, each of the electrodes 20 connects, to each other, an end portion 12ae (see FIG. 1) of the n-type semiconductor part 32a on the opposite side to the intrinsic semiconductor part 12c of one thermoelectric transducer 12 and an end portion 12be (see FIG. 1) of the p-type semiconductor part 12b on the opposite side to the intrinsic semiconductor part 12c of another thermoelectric transducer 12. In other words, each of the electrodes 20 connects, to each other, parts having the highest band gap energy.

The transducer stack 18 is housed in a casing 22 (in FIG. 5, only a part of the wall 22a is illustrated). The casing 22 is attached to the outer surface 16a of the exhaust pipe 16 by means of an attachment that is not shown. The casing 22 has a high thermal conductivity. Also, the outside of the easing 22 is insulated from the inside thereof. In the present embodiment, the thermoelectric transducer module 14 is configured by the plurality of thermoelectric transducers 12 and the electrodes 20 (that is, the transducer stack 18), as well as the casing 22 that contains them. Heat from the exhaust pipe 16 is transferred, via the wall 22a of the casing 22, to each of the thermoelectric transducers 12 of the transducer stack 18. However, depending on the environment in which the thermoelectric transducer module 14 is installed, the casing 22 may be omitted.

In addition, the number of the thermoelectric transducers 12 which the thermoelectric transducer module 14 shown in FIG. 5 includes is just an example. A greater number of thermoelectric transducers 12 may be connected in series or in parallel. Moreover, if the thermoelectric transducer 12 has enough power generation capability, the thermoelectric transducer module 14 may include a single thermoelectric transducer 12. That is, the number of the thermoelectric transducers 12 included in the thermoelectric transducer module 14 is determined on the basis of the electric power that the thermoelectric transducer module 14 is required to generate and the electric power that one thermoelectric transducer 12 can generate.

[Configuration of Power Generator]

The power generator 30 is a device to functionalize the thermoelectric transducer module 14 described above. As shown in FIGS. 4 and 5, the power generator 10 according to the present embodiment is provided with an electric circuit 24 along with the thermoelectric transducer module 14, and an electronic control unit (ECU) 26. Conducting wires 28 for taking an electric power out of the thermoelectric transducer module 14 is pulled out from the thermoelectric transducers 12 that are located at the both ends of the transducer stack 18.

The conducting wires 28 described above are connected to an external load device 30 and thereby the electric circuit 24 is made. When the thermoelectric transducer module 14 receives heat input, the generation of electric power by the thermoelectric transducer module 14 starts. As described repeatedly, the temperature difference is not required for the generation of electric power by the thermoelectric transducer 12. Therefore, the thermoelectric transducer module 14 receives heat input and generates electric power even in the environment without the temperature difference. According to the principle of power generation of the thermoelectric transducer 12 described above, the p-type semiconductor part 12b serves as a positive electrode, and the n-type semiconductor part 12a serves as a negative electrode. Therefore, an electric current caused by the electromotive voltage produced by power generation flows in a direction from the p-type part to the n-type part, as shown in FIG. 5.

The load device 30 is a device that uses electric power. For example, an electric component of the vehicle (such as a headlight or an air-conditioner), an electric motor or a battery that stores electric power corresponds to this kind of the load device 30. A switch 32 for opening and closing of the electric circuit 24 is connected thereto. The opening and closing the switch 32 is controlled by the ECU 26. That is, turning on or turning off an electric current that flows through the electric circuit 24 is switched by the ECU 26. In addition, a current regulator (for example, a variable resistance) may be connected to the load device 30 in series, as well as the switch 32. According to this kind of current regulator, an electric current that flows through the electric circuit 24, that is, an electric current applied to the electric circuit 24 from the thermoelectric transducer module 14, can be changed by varying the resistance value of the variable resistance. Therefore, the electric power supplied to the load device 30 from the thermoelectric transducer module 14 can be controlled more minutely.

The ECU 26 is provided with at least one memory 26a and at least one processor 26b. The memory 26a stores various data including programs and maps that are used for the exhaust heat recovery control. Functions for the exhaust heat recovery control by the ECU 26 are implemented by reading a program from the memory 26a and executing it by the processor 26b.

[Configuration of Malfunction Detection Device]

According to the power generator 10 described so far that uses the thermoelectric transducers 12, power generation can be performed without requiring the temperature difference. When this kind of power generator 10 is used, if a malfunction occurs at a component part, such as the thermoelectric transducer 12 or the electrode 20, there is the possibility that an intended electric power may not be generated. Therefore, the system according to the present embodiment is provided with a malfunction detection device 40 for detecting a malfunction of the power generator 10. The malfunction detection device 40 is provided with the ECU 26 described above, a plurality of temperature sensors (for example, a thermocouple) 34, a plurality of electric voltage sensors 36, and an electric current sensor 38. In this way, the ECU 26 not only corresponds to a control device for the exhaust heat recovery control but also serves as a main component element of the malfunction detection device 40. In addition, an ECU that is used for the exhaust heat recovery control and an ECU which the malfunction detection device 40 includes may be provided separately from each other.

[Acquisition (Detection or Estimation) of Temperatures of Thermoelectric Transducer at Three Points]

Figure 6:
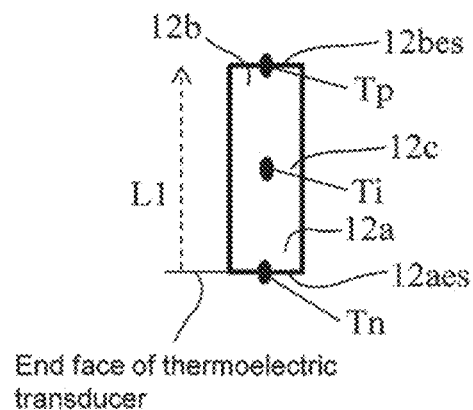
FIG. 6 is a diagram for describing portions at which temperatures are obtained in each thermoelectric transducer.

FIG. 6 is a diagram for describing portions at which temperatures are obtained in each thermoelectric transducer 12. The acquisition of temperatures of each thermoelectric transducer 12 is performed with respect to three different points shown by circles in FIG. 6. These temperatures at the three points correspond to the temperature Ti of the intrinsic semiconductor part 12c at which the band gap energy is the lowest, the temperature Tn of the end face 12aes of the n-type semiconductor part 12a and the temperature Tp of the end face 12bes of the p-type semiconductor part 12b.

The plurality of temperature sensors 34 described above are installed to detect or estimate the temperatures at the three points in each thermoelectric transducer 12 of the thermoelectric transducer module 14. To be more specific, as shown in FIG. 5, some of the temperature sensors 34 are attached to the surfaces of the intrinsic semiconductor parts 12c of the thermoelectric transducers 12. Some of the temperature sensors 34 are also attached to the electrodes 20. Each of the electrodes 20 that are made of a metal material has a high thermal conductivity. Accordingly, in the example shown in FIG. 5, with respect, to the n-type semiconductor part 12a and the p-type semiconductor part 12b that are adjacent to each other with the electrode 20 interposed therebetween (that is, the n-type semiconductor part 12a and the p-type semiconductor part 12b other than the n-type semiconductor part 12a and the p-type semiconductor part 12b that are located at the both ends of the transducer stack 18), the temperature Tn of the end face 12aes and the temperature Tp of the end face 12bes are estimated as being equal to the temperature of the corresponding electrode 20. Furthermore, with respect to the n-type semiconductor part 12a and the p-type semiconductor part 12b that are located at the both ends of the transducer stack 18, the temperature sensors 34 are also attached to the end portion 12ae of the n-type semiconductor part 12a and the end portion 12be of the p-type semiconductor part 12b.

Moreover, the plurality of electric voltage sensors 36 described above are provided to the respective thermoelectric transducers 12 of the transducer stack 18 to detect the electric voltages at the both ends of each thermoelectric transducer 12 (in FIG. 5, only one of the electric voltage sensors 36 is illustrated). The electric current sensor 38 detects an electric current that flows through the electric circuit 24 (illustrated in only FIG. 5).

Figure 7:
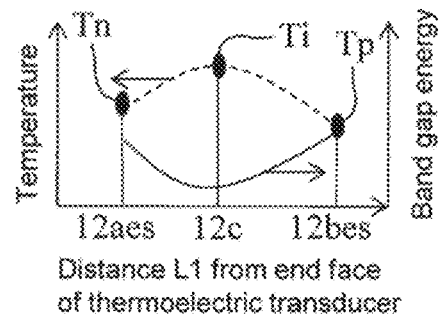
FIG. 7 is a diagram that illustrates a temperature distribution and a distribution of the band gap energy inside the thermoelectric transducer in a direction perpendicular to an end face of the thermoelectric transducer.

FIG. 7 is a diagram that illustrates a temperature distribution and a distribution of the band gap energy inside the thermoelectric transducer 12 in a direction perpendicular to the end face of the thermoelectric transducer 12 (hereafter, referred to as an "L1 direction" in reference to the distance L1 for convenience of explanation). The temperature distribution shown in FIG. 7 represents an example in which the temperature Ti of the intrinsic semiconductor part 12c is higher than the temperature Tn of the end face 12aes and the temperature Tp of the end face 12bes. The distribution of the band gap energy in the thermoelectric transducer 12 is matched with the description on FIGS. 2A and 2B. More specifically, the distribution of the band gap energy of the thermoelectric transducer 12 used in the present disclosure is determined depending on the concrete structure of the thermoelectric transducer 12. However, the basic characteristics that the band gap energy is the lowest at the intrinsic semiconductor part 12c and the highest at the n-type semiconductor part 12a and the p-type semiconductor part 12b are common without depending on the structure of the thermoelectric transducer 12.

The actual electromotive voltage Vta of the thermoelectric transducer 12 depends on the temperature of the thermoelectric transducer 12 as described with reference to FIG. 3. However, if the distribution of the band gap energy changes (that is, if the value of the band gap energy at each location in the L1 direction changes), the actual electromotive voltage Vta changes. To be more specific, under the same temperature, the lower the band gap energy is, the more effectively the above described thermal excitation of electrons is promoted. According to the principle of power generation described above, with respect to the intrinsic semiconductor part 12c, a low band gap energy causes the actual electromotive voltage Vta to increase. On the other hand, with respect to the end face 12aes of the n-type semiconductor part 12a and the end face 12bes of the p-type semiconductor past 12b, a low band gap energy cause the generation of the actual electromotive voltage Vta to be reduced.

Based on the above, it is found that the actual electromotive voltage Vta of the thermoelectric transducer 12 is determined depending on the temperature distribution in the L1 direction and the distribution of the band gap energy. Since the distribution of the band gap energy is determined depending on the structure of the thermoelectric transducer 12 (semiconductor single crystal) as described above, this distribution can be grasped in advance. As shown by the broken line in FIG. 7, the temperature distribution can be approximately grasped on the basis of the temperatures Ti, Tn and Tp at three, points.

Accordingly, in the present embodiment, an estimation value of the electromotive voltage Vt (hereafter, referred to as an "estimated electromotive voltage Vte") is calculated from the temperatures, at those three points by means of a map that defines a relationship between the temperatures Ti, Tn and Tp at three points and the electromotive voltage Vt of the thermoelectric transducer 12. The estimated electromotive voltage Vte corresponds to a designed value of the electromotive voltage Vt that is expected to be exerted under the temperatures Ti, Tn and Tp at certain three points.

Figure 8:
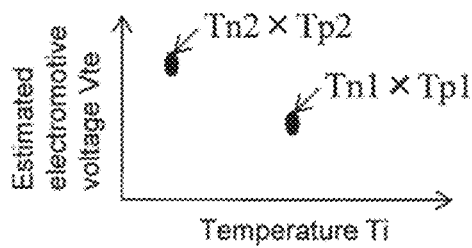
FIG. 8 is an image diagram of a map used for calculation of an estimated electromotive voltage Vte.

FIG. 8 is an image diagram of a map used for calculation of the estimated electromotive voltage Vte. This map is used to calculate the estimated electromotive voltage Vte on the basis of the temperatures Ti, Tn and Tp at three points used as map axes. FIG. 8 represents this map two-dimensionally with the temperature Ti and the estimated electromotive voltage Vte used as its axes. In FIG. 8, two snap values of the estimated electromotive voltage Vte that are identified by the temperatures Ti, Tn and Tp at three points are shown as an example. This kind of map can be obtained in advance by experimentally measuring the actual electromotive, voltage Vta of the thermoelectric transducer 12 while changing the temperatures Ti, Tn and Tp at three points. Moreover, according to this kind of method, the map is obtained with taking into consideration the effects, on this map, of the distribution (see FIG. 7) of the band gap energy of the thermoelectric transducer 12 which is used.

In further addition to the above, the three temperature measurement points used for the map correspond to a portion at which the band gap energy is the lowest in the thermoelectric transducer 12 (that is, the intrinsic semiconductor part 12c) and two portions at which the band gap energy is the highest (that is, the end faces 12aes and 12bes). Thus, each of the temperature measurement points especially has a profound effect on the generation of the actual electromotive voltage Vta. Because of this, by using the temperatures Ti, Tn and Tp at this kind of three points, the temperature distribution is the thermoelectric transducer 12 can be accurately grasped, and, as a result, the estimated electromotive voltage Vte can be estimated accurately. In addition, the relationship between the temperatures Ti, Tn and Tp at three points and the estimated electromotive voltage Vte may not be always determined as a map, and may be defined with a calculation formula, for example.

[Problem on Known Malfunction Detection Method]

As a malfunction detection, method for a thermoelectric transducer based on the Seebeck effect, the following method is known. That is, according to the power generator equipped with the thermoelectric transducer using the Seebeck effect, an electromotive voltage is generated by actively providing a temperature difference between the both sides of the thermoelectric transducer. Thus, according to this kind of known power generator, by obtaining the temperatures at two points that are the end face on the higher temperature side and the end face on the lower temperature side of the thermoelectric transducer, the electromotive voltage of the thermoelectric transducer and also the electromotive voltage of a thermoelectric transducer module can be estimated. Also, by comparing the estimated electromotive voltage with an actual electromotive voltage which is measured, a malfunction of the power generator can be detected.

In the thermoelectric transducer using the Seeback effect, power generation is not performed under a condition in which the temperatures at the both ends are equal to each other. Thus, according to the known estimation method described above, the electromotive voltage is estimated as zero under the condition in which the temperatures at the both ends are equal to each other. On the other hand, according to the thermoelectric transducer 12 of the present embodiment, its principle of power generation is different from that of the thermoelectric transducer using the Seeback effect, and the power generation can be performed depending on the temperature of the thermoelectric transducer 32 as shown in FIG. 3 even when the temperatures Tn and Tp at the both ends are equal to each other. It can therefore be said that the known estimation method cannot accurately estimate the electromotive voltage Vt of the thermoelectric transducer 12 of the present disclosure under the condition in which the temperatures at the both ends are equal to each other.

In contrast to the above, according to the method of the present embodiment described with reference to FIGS. 6 to 8, the estimated electromotive voltage Vte can be calculated using the temperatures Ti, Tn and Tp at three points. Therefore, in the power generator 10 equipped with the thermoelectric transducers 12 (that is, the thermoelectric transducer module 14) based on the principle of power generation according to the present embodiment, the estimated electromotive voltage Vte can be accurately calculated.

[Concrete Malfunction Detection Process according to First Embodiment]

Figure 9:
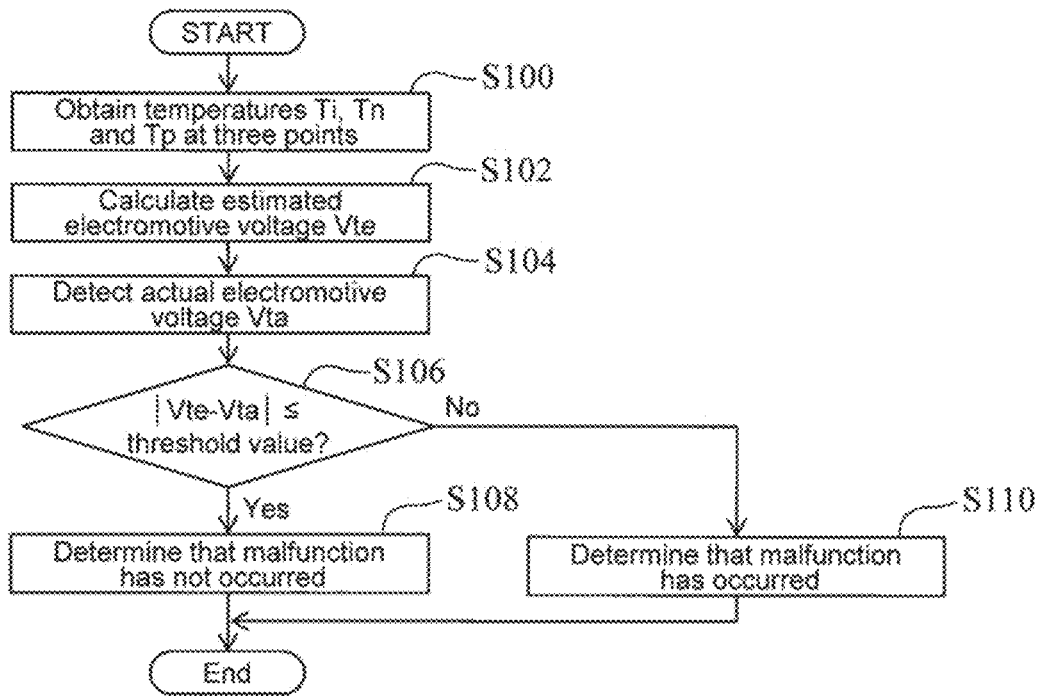
FIG. 9 is a flow chart that illustrates an example of a routine of a malfunction detection process according to the first embodiment of the present disclosure.

FIG. 9 is allow chart that illustrates, an example of a routine of the malfunction detection process according to the first embodiment of the present disclosure. The processing of this routine is started under a temperature condition in which the thermoelectric transducer module 14 can perform the power generation as a result of the supply of heat from the heat generating apparatus (in this example, internal combustion engine). Moreover, the processing of the present routine is assumed to be executed for each thermoelectric transducer 12 of the thermoelectric transducer module 14.

According to the routine shown in FIG. 9, first, the ECU 26 obtains the temperatures at three points of the thermoelectric transducer 12 that is subject to determination (that is, the temperature Ti of the intrinsic semiconductor part 12c, the temperature Tn of the end face 12aes of the n-type semiconductor part 12a and the temperature Tp of the end face 12bes of the p-type semiconductor part 12b) (step S100). In more detail, a temperature at a portion to which the temperature sensor 34 is attached, of the temperatures at three points is detected using the temperature sensor 34. Also, the temperatures Tn and Tp of the end faces 12aes and 12bes that are adjacent to the electrode 20 are estimated as the same value as that of the temperature of the electrode 20 detected using the temperature sensor 34. In addition, the temperatures Tn and Tp of the end feces 12aes and 12bes that are adjacent to the electrode 20 may also be detected using the respective different temperature sensors 34.

Next, the ECU 26 calculates the estimated electromotive voltage Vte of the thermoelectric transducer 12 that is subject to determination (step S102). In the ECU 26, a map as described with reference to FIG. 8 is stored. In step S102, the estimated electromotive voltage Vte corresponding to the temperatures at the three points obtained in step S100 is calculated with reference to this kind of map.

Next, the ECU 26 detects an actual electromotive voltage Vta of the thermoelectric transducer 12 that is subject to determination (step S104). For example, the actual electromotive voltage Vta can be detected using the electric voltage sensor 36 with the switch 32 open.

Next, the ECU 26 determines whether or not the absolute value of the difference (Vte−Vta) between the estimated electromotive voltage Vte and the actual electromotive voltage Vta that are respectively obtained in steps S102 and S104 is less than or equal to a certain threshold value (step S106). This threshold value is a value determined in advance as an upper limit of values that is assumed as an error between the estimated electromotive voltage Vte and the actual electromotive voltage Vta. In the present embodiment, it is determined, with the processing of step S106, whether or not the degree of deviation of the actual electromotive voltage Vta with respect to the estimated electromotive voltage Vte is greater than or equal to a first threshold value. In addition, whether or not the degree of this deviation is greater than or equal to the first threshold value may not be always determined using the difference between the estimated electromotive voltage Vte and the actual electromotive voltage Vta, and may be, for example, determined by comparing, with a certain threshold value, a ratio of the actual electromotive voltage Vta with respect to the estimated electromotive voltage Vte. This also applies to the following determinations of steps S204, S308 and S404.

If the result of the determination in step S106 is positive, that is, if the absolute value of the aforementioned difference (Vte−Vta) between the electromotive voltages is less than or equal to the threshold value described above, the ECU 26 then determines that malfunction, has not occurred at the thermoelectric transducer 12 that is subject to determination (step S108). In addition, if malfunction has not been recognized in any thermoelectric transducers 12 as a result of execution of the processing of the present routine with respect to all the thermoelectric transducers 12 of the thermoelectric transducer module 14, it can be determined that malfunction has not occurred at the power generator 10.

If, on the other hand, the result of the determination in step S106 is negative, that is, if the absolute value of the aforementioned difference (Vte−Vta) is greater than the threshold value described above, the ECU 26 then determines that a malfunction has occurred at the thermoelectric transducer 12 that is subject to determination (step S110). Thus, a malfunction of the power generator 10 is detected.

According to the malfunction detection process of the routine shown in FIG. 9 described so far, if the actual electromotive voltage Vta is deviated from the estimated electromotive voltage Vte based on the temperatures Ti, Tn and Tp at three points of the thermoelectric transducer 12 beyond a range that is assumed as the error therebetween, a malfunction of the power generator 10 is detected on the ground that malfunction has occurred at the thermoelectric transducer 12 that is subject to determination. As described above, the malfunction detection process using the estimated electromotive voltage Vte based on the temperatures at three points can accurately detect a malfunction of the power generator 10 equipped with the thermoelectric transducers 12 that can perform the power generation even when there is no temperature difference.

Additionally, in the first embodiment described above, the processor 26b of the ECU 26 that is programmed to: execute the processing of step S100; execute the processing of step S102; execute the processing of step S304; and execute the processing of steps S106 to S110, corresponds to the "processor" according to the present disclosure. Also, the temperature Tn of the end face 12aes of the n-type semiconductor part 12a corresponds to the "n-type end portion temperature" according to the present disclosure; the temperature Tp of the end face 12bes of the p-type semiconductor part 12b corresponds to the "p-type end portion temperature" according to the present disclosure; the temperature Ti of the intrinsic semiconductor part 12c corresponds to the "intrinsic portion temperature" according to the present disclosure; and the determination in step S106 corresponds to the "first determination" according to the present disclosure. Furthermore, the n-type end portion temperature may not be always the temperature Tn of the end face 12aes, as far as it corresponds to the temperature of the end portion 12ae (that is, the end face 12aes and the portion in the vicinity thereof). This also applies to the p-type end portion temperature. Moreover, in order to obtain the temperatures at three points of the thermoelectric transducer 12, a thermo-viewer may be, for example, used instead of the aforementioned temperature sensors 34.

Second Embodiment

Next, a second embodiment according to the present disclosure will be described with reference to FIGS. 10 and 11. A malfunction detection process according to the second embodiment is also addressed to the power generator 10 as in the first embodiment. Also, the hardware configuration of a malfunction detection device according to the second embodiment is the same as that of the malfunction detection device 40 according to the first embodiment. This also applies to third and fourth embodiments described later.

[Concrete Malfunction Detection Process According to Second Embodiment]

The value of internal resistance of each thermoelectric transducer 12 that the thermoelectric transducer module 14 includes may change with a lapse of time. If the value of the internal resistance of the thermoelectric transducer 12 changes, the electric power (the following generated electric power) generated by the thermoelectric transducer 12 changes, and, as a result, the generated electric power of the thermoelectric transducer module 14 also changes. In addition, the term "generated electric power" used in this specification, means an electric power taken out of the thermoelectric transducer 12 or the thermoelectric transducing module 14. That is, an electric power consumed by the internal resistance of the thermoelectric transducer 12 is not included in the "generate electric power" of the thermoelectric transducer 12. This, also applies to the thermoelectric transducer module 14.

If the generated electric power of the thermoelectric transducer 12 changes in association with a change of the internal resistance thereof there is the possibility that the electric power that is actually generated (hereafter, referred to as an "actual generated electric power Pta") may be deviated from its normal range even when the actual electromotive voltage Vta is within its normal range. Accordingly, in the present embodiment, the malfunction detection of the power generator 10 is performed by comparing the actual generated electric power Pta with an estimated generated electric power Pte on a transducer-to-transducer basis. The estimated generated electric power Pte mentioned here refers to a generated electric power estimated from the estimated electromotive voltage Vte based on the temperatures Ti, Tn and Tp at the aforementioned three points of the thermoelectric transducer 12.

Figure 10:
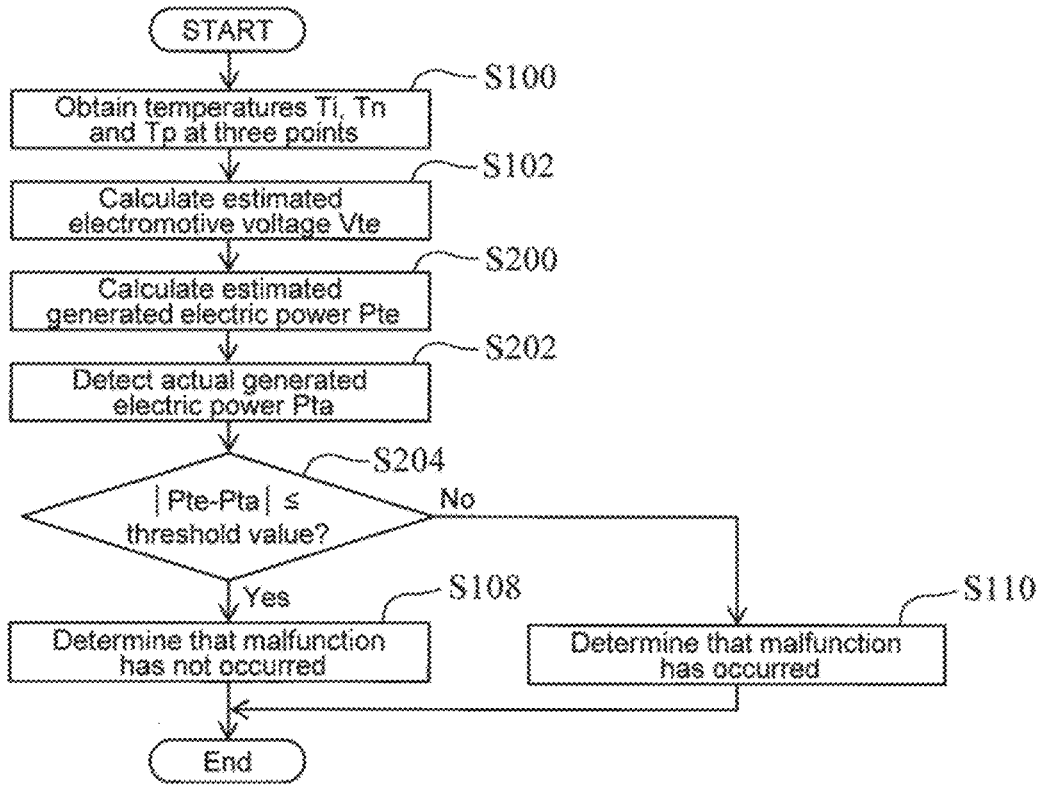
FIG. 10 is a flow chart that illustrates an example of a routine of a malfunction detection process according to a second embodiment of the present disclosure.

FIG. 10 is a flow chart that illustrates an example of a routine of the malfunction detection process according to the second embodiment of the present disclosure. The processing of steps S100, S102, S108 and S110 in the routine shown in FIG. 10 has already been described in the first embodiment.

According to the routine shown in FIG. 10, the ECU 26 calculates the estimated generated electric power Pte of the thermoelectric transducer 12 that is subject to determination following the calculation of the estimated electromotive voltage Vte in step S102 (step S200). FIG. 11 is a diagram that illustrates an equivalent circuit of the power generator 10. As shown in FIG. 11, the equivalent circuit of the power generator 10 is expressed by a DC power supply 42 having a voltage value Vm and two resistances 44 and 46 serially-connected to the DC power supply 42. The voltage value Vm of the DC power supply 42 represents the electromotive voltage of the thermoelectric transducer module 14.

Figure 11:
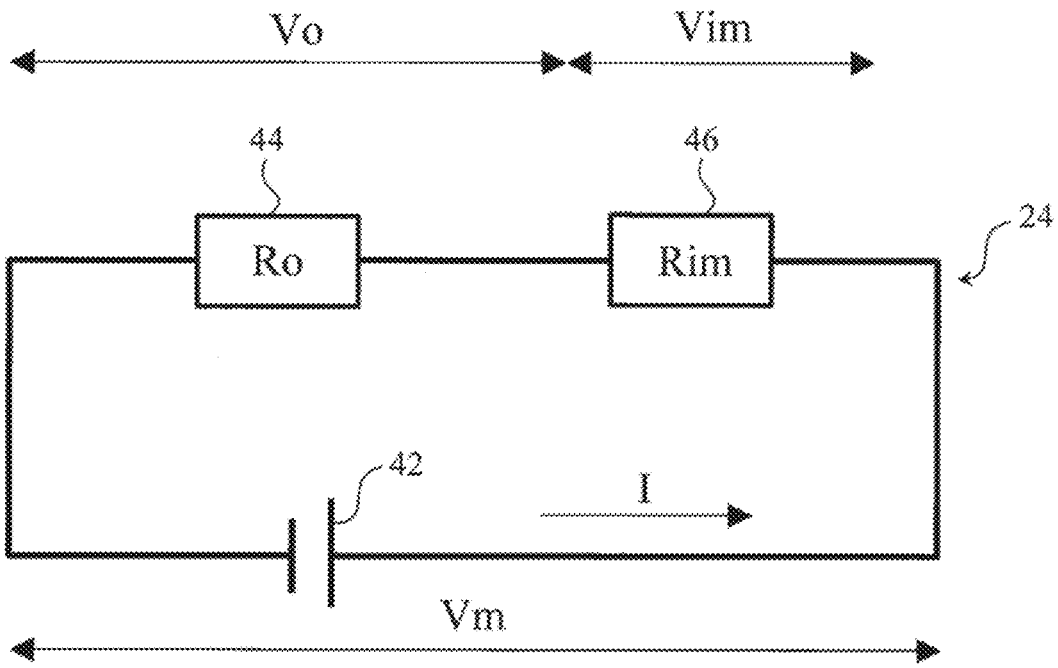
FIG. 11 is a diagram that illustrates an equivalent circuit of the power generator.

In FIG. 11, the resistance 44 is an external resistance, and, in the power generator 10, corresponds to a load resistance of the load device 30. A resistance value Ro represents a resistance value of the external resistance (load resistance) 44. Hereafter, this resistance value is referred to as an "external resistance value Ro". The resistance 46 is an internal resistance of the thermoelectric transducer module 14, and a resistance value Rim represents a resistance value of the internal resistance 46. Hereinafter, this resistance value is referred to as an "internal resistance value Rim". Moreover, in FIG. 11, the value of the voltage applied to the external resistance 44 is represented by Vo, the value of the voltage applied to the internal resistance 46 is represented by Vim, and the value of the electric current flowing in the electric circuit 24 is represented by I. In addition, in an example in which a variable resistance is arranged in the electric circuit 24 in series with the load device 30, the sum of the resistance value of the variable resistance and the resistance value Ro is equivalent to an external resistance value.

In the equivalent circuit shown in FIG. 11, the value Vim of the electric voltage applied to the internal resistance 46 is expressed by the electromotive voltage value Vm, the internal resistance value Rim and the external resistance value Ro as shown by equation (2) described below. Moreover, the generated electric power (that is, the electric power generated by the thermoelectric transducer module 14 to be taken out thereof) Pm is a product of the value Vo of the electric voltage applied to the external resistance 44 and the electric current value I (=Vim/Rim). As shown by equation (2), the generated electric power Pm can be expressed by the electromotive voltage value Vm, the internal resistance value Rim and the external resistance value Ro with use of the relationship of equation (1). In equation (2), the internal resistance value Rim is a known value that is defined depending on the structure of the thermoelectric transducer module 14. The external resistance value Ro is a given value that is defined depending on the operational state of the load device 30.

$$Vim = (Rim/(Ro + Rim)) \times Vm \quad (1)$$

$$Pm = Vo \times I = Ro \times I^2 = Ro \times (Vim/Rim)^2 = Ro \times (Vm/(Ro + Rim))^2 \quad (2)$$

In the thermoelectric transducer module 14, the thermoelectric transducers 12 are connected to each other in series. Thus, where the estimated electromotive voltage of the thermoelectric transducer module 14 is referred to as "Vme" and the number of the thermoelectric transducers 12 of the thermoelectric transducer module 14 is referred to as "N", the estimated electromotive voltage Vte of each thermoelectric transducer 12 can be calculated by dividing the estimated electromotive voltage Vme by the number N of transducers. Moreover, an internal resistance value Rit of each thermoelectric transducer 12 can be calculated by dividing the internal resistance value Rim of the thermoelectric transducer module 14 by the number N of transducers. Furthermore, where the estimated generated electric power of the thermoelectric transducer module 14 is referred to as "Pme", an estimated generated electric power Pte of each thermoelectric transducer 12 can be calculated by dividing the estimated generated electric power Pme by the number N of transducers. Thus, the estimated generated electric power Pte of each thermoelectric transducer 12 can be expressed as shown by equation (3) described below by deforming the relationship of equation (2) with respect to the thermoelectric transducer module 14. In addition, in equation (3), the resistance value of each electrode 20 of the thermoelectric transducer module 14 is not taken into consideration. In contrast to this, in order to improve the calculation accuracy of the estimated generated electric power Pte, the resistance value of each electrode 20 may be takes into consideration.

$$Pte = \frac{Pme}{N} = \frac{Ro}{N} \times \left(\frac{Vte \times N}{Ro + Rit \times N}\right)^2 \quad (3)$$

In step S200, the estimated generated electric power Pte of the thermoelectric transducer 12 that is subject to determination is calculated in accordance with equation (3). The value of the estimated electromotive voltage Vte used to this calculation is a calculation value by the processing of step S100. The internal resistance value Rit of the thermoelectric transducer 12 and the number N of transducers are known values. A manner of detecting the external resistance value (the load resistance value) Ro is not limited. One manner of detecting the external resistance value Ro is to measure an electric current flowing in the load device 30 and a voltage applied to the load device 30 and then calculate the load resistance value Ro from those measurements. Another manner of detecting the external resistance value Ro is to measure an external resistance value in every operational state of the load device 30, make a map that associates the load resistance value with the operational state of the load device 30 based on measurement results and then store the map in a memory.

Next, the ECU 26 detects an actual generated electric power Pta of the thermoelectric transducer 12 that is subject to determination (step S202). A manner of detecting the actual generated electric power Pta is also not limited. As an example, in step S202, the electric voltage at the both ends of the thermoelectric transducer 12 is detected by means of the electric voltage sensor 36 in a state in which the switch 32 is closed (that is, a state in which the thermoelectric transducer 12 continues to generate the electric power). Moreover, the value I of the electric current flowing in the thermoelectric transducer 12 is detected by means of the electric current sensor 38. On that basis, the actual generated electric power Pta is calculated as a product of those detection values.

Next, the ECU 26 determines whether or not the absolute value of the difference (Pte−Pta) between the estimated generated electric power Pte and the actual generated electric power Pta that are calculated in steps S200 and S202 is less than or equal to a certain threshold value (step S204). This threshold value is a value determined in advance as an upper limit of values that are assumed to be an error between the estimated generated electric power Pte and the actual generated electric power Pta. In the present embodiment, it is determined, by the processing of step S204, whether or not the degree of deviation of the actual generated electric power Pta with respect to the estimated generated electric power Pte is greater than or equal to a second threshold value.

If the result of the determination in step S204 is positive, that is, if the absolute value of the aforementioned difference (Pte−Pta) between the generated electric powers is less than or equal to the threshold value described above, the ECU 26 then determines that a malfunction has not occurred at the thermoelectric transducer 12 that is subject to determination (step S108). If, on the other hand, the result of the determination in step S204 is negative, that is, if the absolute value of the aforementioned difference (Pte−Pta) between the generated electric powers is greater than the threshold value described above, the ECU 26 then determines that a malfunction has occurred at the thermoelectric transducer 12 that is subject to determination (step S110). Thus, a malfunction of the power generator 10 is detected.

According to the malfunction detection process of the routine shown in FIG. 10 described so far, if the actual generated electric power Pta is deviated from the estimated generated electric power Pte estimated from the estimated electromotive voltage Vte based on the temperatures Ti, Tn and Tp at three points of the thermoelectric transducer 12 beyond a range that is assumed as the error therebetween, a malfunction of the power generator 10 is detected on the ground that a malfunction has occurred at the thermoelectric transducer 12 that is subject to determination. Furthermore, this kind of manner can accurately detect a malfunction that, although the actual electromotive voltage Vta of the thermoelectric transducer 12 is normal, an intended actual generated electric power Pta is not generated on the ground that its internal resistance value Rit changes with a lapse of time.

Alternatively, with respect to the malfunction detection process according to the first embodiment focused on the electromotive voltage Vt of the thermoelectric transducer 12 and the malfunction detection process according to the second embodiment focused on the generated electric power Pt of the thermoelectric transducer 12, both of these malfunction detection processes may be performed in series, instead of any one of the malfunction detection processes being performed solely. Then, when the result of the determination on any one or both of these malfunction detection processes is positive, a malfunction of the power generator 10 may be detected. Moreover, by performing both the malfunction detection processes, it can also be discriminated whether the malfunction of the power generator 10 results from the actual electromotive voltage Vta or a parameter other than the actual electromotive voltage Vta including the internal resistance value Rit.

Moreover, in the first and second embodiments described above, detection of malfunction is performed for each thermoelectric transducer 12 with respect to all the thermoelectric transducers 12 of the thermoelectric transducer module 14. However, the malfunction detection process that is performed on a transducer-to-transducer basis may not be always performed for all thermoelectric transducers of a thermoelectric transducer module, and may be performed for one or some of the thermoelectric transducers of the thermoelectric transducer module.

Additionally, in the second embodiment described above, the processor 26b of the ECU 26 that is programmed to: execute the processing of step S100; execute the processing of steps S102 and S200; execute the processing of step S202; and execute the processing of steps S108, S110 and S204, corresponds to the "processor" according to the present disclosure. Also, the determination, in step S204 corresponds to the "second determination" according to the present disclosure.

Third Embodiment

Next, a third embodiment according to the present disclosure will be described with reference to FIG. 12.
[Concrete Malfunction Detection Process according to Third Embodiment]

A malfunction detection process according: to the present embodiment is in common with that according to the first embodiment in that the "electromotive voltage V" is used. However, the malfunction detection process according to the present embodiment is performed on the module basis in a manner described below with reference to FIG. 12, which is addressed to the whole thermoelectric transducer module 14 instead of the individual thermoelectric transducers 12.

Figure 12:
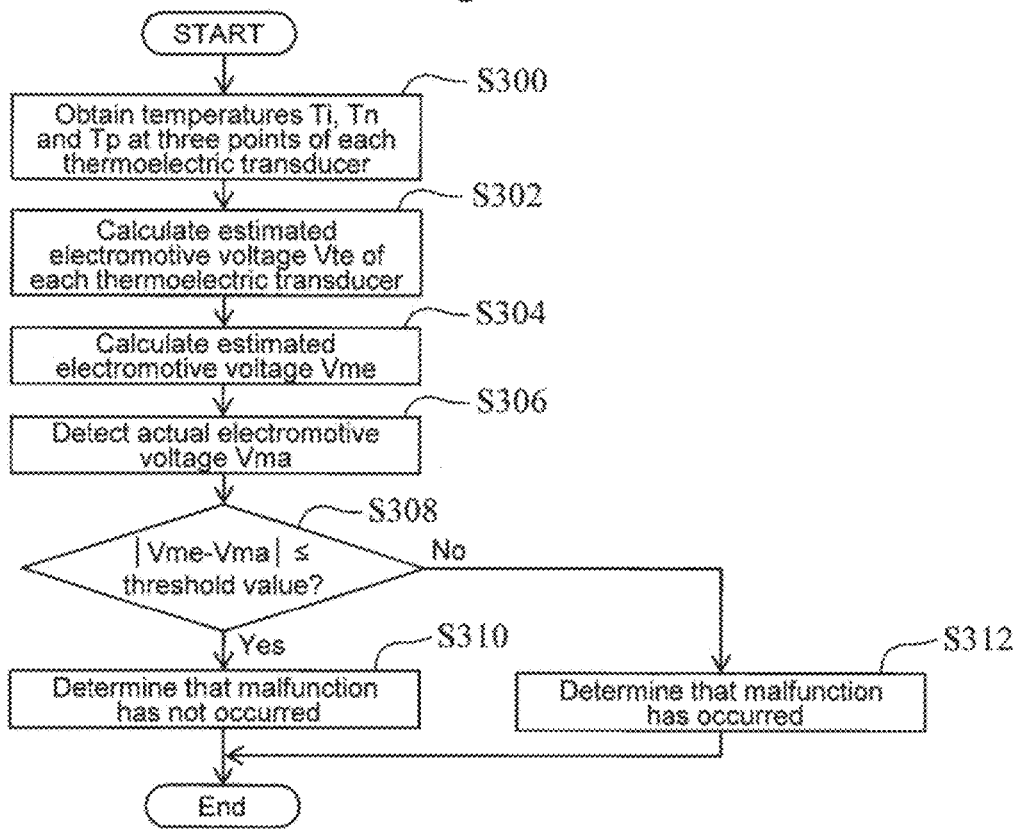
FIG. 12 is a flow chart that illustrates an example of a routine of a malfunction detection process according to a third embodiment of the present disclosure.

FIG. 12 is a flow chart that illustrates an example of a routine of the malfunction detection process according to the third embodiment of the present disclosure. As with the routine shown in FIG. 9, the processing according to the present routine is also started under a condition in which the thermoelectric transducer module 14 can generate the electric power by receiving the supply of heat from the heat generating apparatus (in this example, internal combustion engine).

In the routine shown in FIG. 12, first, the ECU 26 obtains the temperatures Ti, Tn and Tp at three points of all the thermoelectric transducers 12 of the thermoelectric transducer module 14 (step S300). The concrete manner of acquiring the temperatures at three points is the same as that of step S100.

Next, the ECU 26 calculates the estimated electromotive voltages Vte of all the thermoelectric transducers 12 in series (step S302). Specifically, the estimated electromotive voltages Vte of the respective thermoelectric transducers 12 are calculated in series by means of a map that defines a relationship between the temperatures at three points and the estimated electromotive voltage Vte as in step S102.

Next, the ECU 26 calculates the estimated electromotive voltage Vme of the thermoelectric transducer module 14 (step S304). The thermoelectric transducer module 14 is configured by directly connecting the plurality of thermoelectric transducers 12. Thus, the estimated electromotive voltage Vme of the thermoelectric transducer module 14 is calculated by adding, to each other, the estimated electromotive voltages Vte of all the thermoelectric transducers 12 obtained in step S302. In addition, with respect to this calculation of the estimated electromotive voltage Vme, the voltage drop at each electrode 20 is not taken into consideration. However, in order to detect a malfunction more accurately, the estimated electromotive voltage Vme may be calculated with taking into consideration the voltage drop at each electrode 20.

Next, the ECU 26 detects an actual electromotive voltage Vma of the thermoelectric transducer module 14 (step S306). The actual electromotive voltage Vma can be detected, for example, by detecting the electric voltage at the both ends of each thermoelectric transducer 12 in a state in which the switch 32 is open and by adding the obtained detection values to each other. Alternatively, an electric voltage sensor for detecting the electric voltage at the both ends of the transducer stack 18 may be provided, and the value of the electric voltage detested by the electric voltage sensor in a state in which the switch 32 is open may be used as the actual electromotive voltage Vma.

Next, the ECU 26 determines whether or not the absolute value of the difference (Vme−Vma) between the estimated electromotive voltage Vme and the actual electromotive voltage Vma that are obtained in steps S304 and S306 is less than or equal to a certain threshold value (step S308). This threshold value is a value determined in advance as an upper limit of values that are assumed to be an error between the estimated electromotive voltage Vme and the actual electromotive voltage Vma. In the present embodiment, it is determined, with the processing of step S308, whether or not the degree of deviation of the actual electromotive voltage Vma with respect to the estimated electromotive voltage Vme is greater than or equal to the first threshold value.

If the result of the determination in step S308 is positive (|Vme−Vma|≤threshold value), the ECU 26 then determines that a malfunction has not occurred at the thermoelectric transducer module 14 and that therefore a malfunction has not occurred at the power generator 10 (step S310). If, on the other hand, the result of the determination in step S308 is negative (|Vme−Vma|≤threshold value), the ECU 26 then determines that a malfunction has occurred at the thermoelectric transducer module 14 and that therefore a malfunction has occurred at the power generator 10 (step S312).

According to the malfunction detection process of the routine shown in FIG. 12 described so far, the estimated electromotive voltage Vme of the thermoelectric transducer module 14 is calculated from the estimated electromotive voltage Vte based on the temperatures Ti, Tn and Tp at three points, of each thermoelectric transducer 12. By evaluating, as just described, the error of the actual electromotive voltage Vma with respect to the estimated, electromotive voltage Vme that is calculated on the basis of the aforementioned temperatures at three points, a malfunction of the power generator 10 due to a malfunction of the thermoelectric transducer module 14 can be detected more accurately in the power generator 10 that uses the thermoelectric transducers 12 having the configuration shown in FIGS. 1 to 3.

Additionally, in the third embodiment described above, the processor 26b of the ECU 26 that is programmed to: execute the processing of step S300; execute the processing: of steps S302 and S304; execute, the processing of step S306; and execute the processing of steps S308 to S312, corresponds to the "processor" according to the present disclosure. Also, the determination in step S308 corresponds to the "first determination" according to the present disclosure.

Fourth Embodiment

Next, a fourth embodiment according to the present disclosure will be described with reference to FIG. 13.
[Concrete Malfunction Detection Process according to Fourth Embodiment]

The relationship of the present embodiment with respect to the third embodiment is similar to the relationship of the second embodiment with respect to the first embodiment. That is, a malfunction detection process according to the present embodiment, which is addressed to the whole thermoelectric transducer module 14, is performed by comparing the estimated generated electric power Pme of the thermoelectric transducer module 14 with the actual generated electric power Pma thereof.

Figure 13:
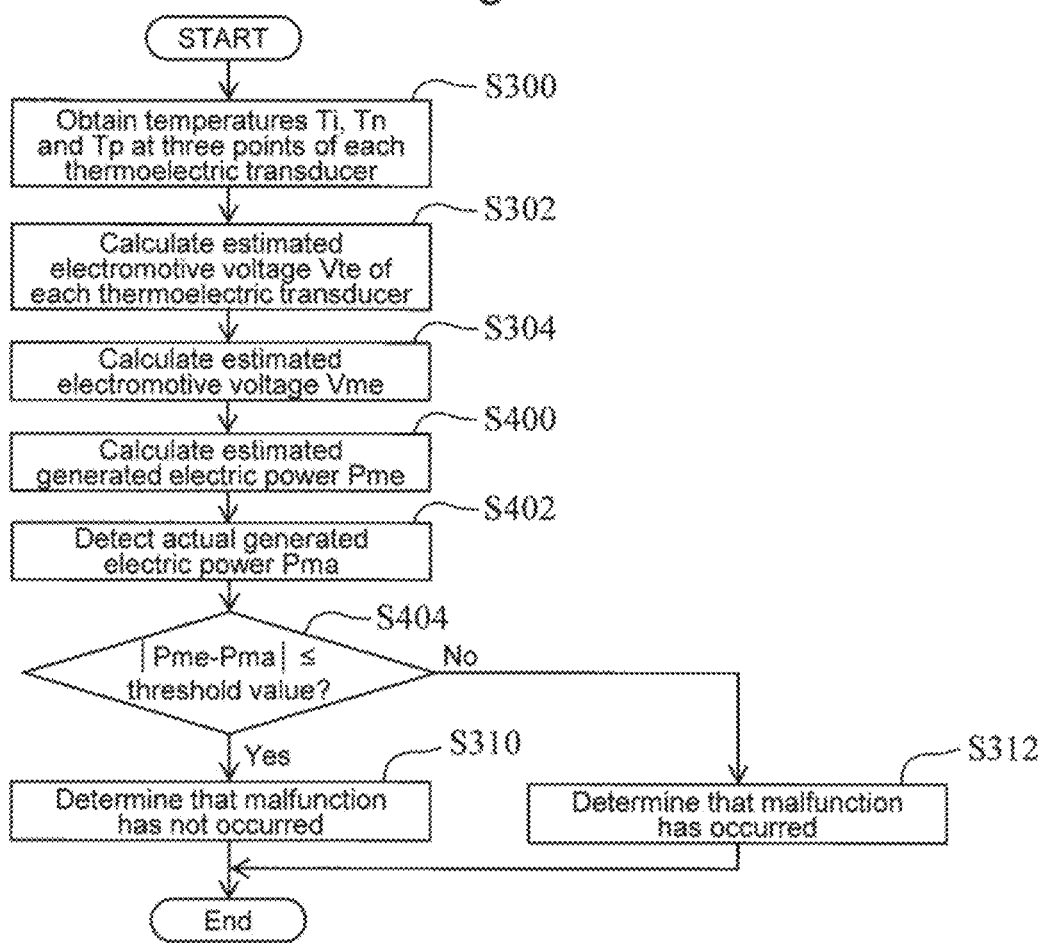
FIG. 13 is a flow chart that illustrates an example of a routine of a malfunction detection process according to a fourth embodiment of the present disclosure.

FIG. 13 is a flow chart that illustrates an example of a routine of the malfunction detection process according to the fourth embodiment of the present disclosure. The processing of steps S300 to S304, S310 and S312 in the routine shown in FIG. 13 has already been described in the third embodiment.

According to the routine shown in FIG. 13, the ECU 26 calculates the estimated generated electric power Pme of the thermoelectric transducer module 14 following the calculation of the estimated electromotive voltage Vme in step S304 (step S400). The estimated generated electric power Pme is calculated by assigning the estimated electromotive voltage Vme, the external resistance value Ro and the internal resistance value Rim to the right-hand side of equation (2) mentioned above. The external resistance value Ro can be detected in a manner described above for step S200. The estimated electromotive voltage Vme is a calculation value by the processing of step S304. The internal resistance value Rim of the thermoelectric transducer module 14 is a known value.

Next, the ECU 26 detects an actual generated electric power Pma of the thermoelectric transducer module 14 (step S402). A manner of detecting the actual generated electric power Pma is also not limited. As an example, in step S402, the electric voltages at the both ends of all the thermoelectric transducers 12 are detected by the electric voltage sensors 36 in a state in which the switch 32 is closed, and the detected electric voltages are added to each other. In this way, the value of electric voltage at the both ends of the thermoelectric transducer module 14 (the transducer stack 18) during power generation is detected. This value of the electric voltage at the both ends may be detected using, an electric voltage sensor for detecting an electric voltage at the both ends of the transducer stack 18. Also, the value I of the electric current flowing in the thermoelectric transducer module 14 is detected by the electric current sensor 38. On that basis, the actual generated electric power Pma is calculated as a product of the value of the electric voltage at the both ends of the thermoelectric transducer module 14 and the electric current value I.

Next, the ECU 26 executes determination of step S404 and then determines, in accordance with on the result of the determination, whether or not there is a malfunction of the power generator 10 due to a malfunction of the thermoelectric transducer module 14 (steps S310 and S312). In step S404, it is determined whether or not the absolute value of the difference (Pme−Pma) between the estimated generated electric power Pme and the actual generated, electric power Pma that are obtained in steps S400 and S402 is less than or equal to a certain threshold value. This threshold value is a value determined in advance as an upper limit of values assumed to be an error between the estimated generated electric power Pme and the actual generated electric power Pma. In the present embodiment, it is determined, with the processing of step S404, whether or not the degree of deviation of the actual generated electric power Pma with respect to the estimated generated electric power Pme is higher than or equal to the second threshold value.

According to the malfunction detection process of the routine shown in FIG. 13 described so far, the estimated generated electric power Pme of the thermoelectric transducer module 14 is calculated from the estimated electromotive voltage Vte based on the temperatures Ti, Tn and Tp at three points of each thermoelectric transducer 12. In this way, by evaluating the error of the actual generated electric power Pma with respect to the estimated generated electric power Pme that is calculated on the basis of the aforementioned the temperatures at three points, a malfunction of the power generator 10 due to a malfunction of the thermoelectric transducer module 14 can be detected more accurately in the power generator 10 that uses the thermoelectric transducers 12 having the configuration shown in FIGS. 1 to 3. Furthermore, this kind of manner can accurately detect a malfunction that, although the actual electromotive voltage Vma of the thermoelectric transducer module 14 is normal, an intended actual generated electric power Pma is not generated on the ground that its internal resistance value Rim changes with a lapse of time.

Alternatively, with respect to the malfunction detection process according to the third embodiment focused on the electromotive voltage Vm of the thermoelectric transducer module 14 and the malfunction detection process according to the fourth embodiment focused on the generated electric power Pm, both of the malfunction detection processes may be performed m series, instead of any one of the malfunction detection processes being performed solely.

Additionally, in the fourth embodiment, described above, the processor 26b of the ECU 26 that is programmed to: execute the processing of step S300; execute the processing of steps S302, S304 and S400; execute the processing; of step S402; and execute the processing of steps S319, S312 and S404, corresponds to the "processor" according to the present disclosure. Also, the determination in step S404 corresponds to the "second determination" according to the present disclosure.

Fifth Embodiment

Next, a fifth embodiment according to the present disclosure will be described with reference to FIGS. 14 and 15.
[Estimation Method of Temperatures Ti, Tn and Tp at Three Points of Thermoelectric Transducer According to Fifth Embodiment]

Figure 14:
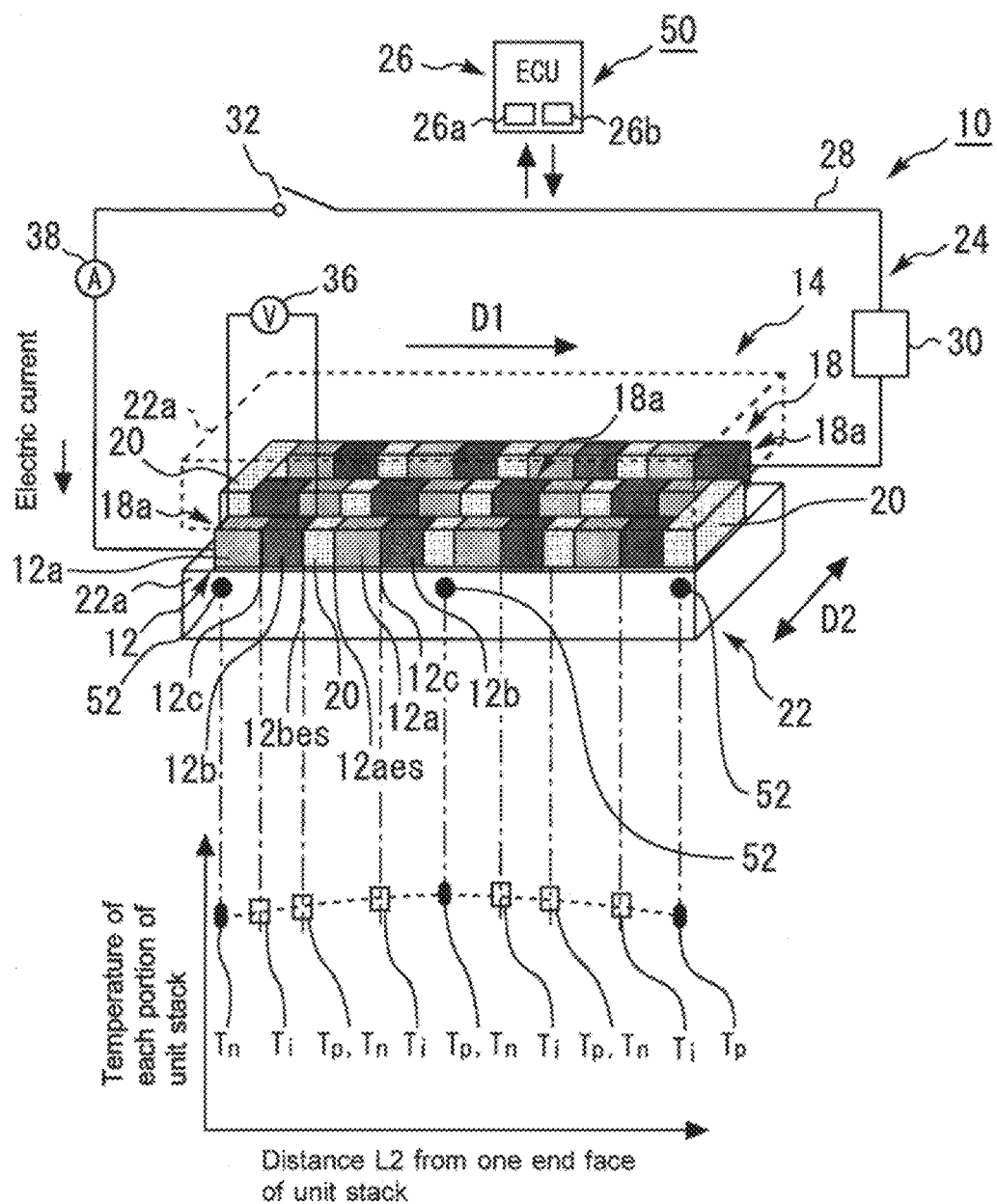
FIG. 14 is a view for describing a temperature estimation method of the thermoelectric transducer according, to a fifth embodiment of the present disclosure.

FIG. 14 is a view for describing a temperature estimation method of the thermoelectric transducer 12 according to the fifth embodiment of the present disclosure. In FIG. 14, as an example of application objects of the temperature estimation method according to the present embodiment, the power generator 10 described above is represented. In more detail, the transducer stack 18 is configured by connecting a plurality of (for example, three) unit stacks 18a in series such that the unit stacks 18a are folded in a serpentine form with each other with the electrode 20 interposed between the adjacent unit stacks 18a.

A set of (four, as an example) thermoelectric transducers 12 that forms each unit stack 18a is arranged in a row on the surface of the wall 22a of the casing 22. In other words, in the configuration shown in FIG. 14, each of a plural sets of (three sets, as an example) thermoelectric transducers 12 is arranged in a row. In the example shown in FIG. 14, although the plural sets of thermoelectric transducers 12 that are each arranged in a low are connected in series with each other with the electrode 20 interposed between the adjacent thermoelectric transducers 12, the plural sets of thermoelectric transducers 12 may be connected in parallel with each other. In addition, in the example shown in FIG. 14, the wall 22a of the casing 22 installed on the outer surface 16a of the exhaust pipe 16 corresponds to the "heat supplier that transfers exhaust heat from the heat generating apparatus" according to the present disclosure.

A malfunction detection device 50 according to the present embodiment is provided with a plurality of temperature sensors 52, instead of the plurality of temperature sensors 34. In more detail, the number of the temperature sensors 52 which are installed is less than the sum (that is, twelve) of the temperatures Ti, Tn and Tp at three points of the unit stacks 18a (each set of thermoelectric transducers 12). As an example, the number is three. As shown in FIG. 14, these temperature sensors 52 are attached to the wait 22a of the casing 22 in such a manner as to be spaced by a predetermined distance from each other and be arranged along a direction parallel to a row of the unit stack 18a (hereafter, simply referred to as a "row direction D1"). More specifically, the temperature sensors 52 are attached to the wall 22a at positions near the unit stacks 18a.

Next the estimation method of the temperatures Ti, Tn and Tp at three points of each thermoelectric transducer 12 will be described with reference to FIG. 15 as well as FIG. 14. FIG. 15 is a flow chart that illustrates an example of a sub routine of a temperature acquisition process of the thermoelectric transducer 12 according to the fifth embodiment of the present disclosure. The result of the processing of this sub routine can be, for example, used in step S100 or S300 in the routine shown in FIG. 9, 10, 12 or 13 described in the first to fourth embodiments.

Figure 15:
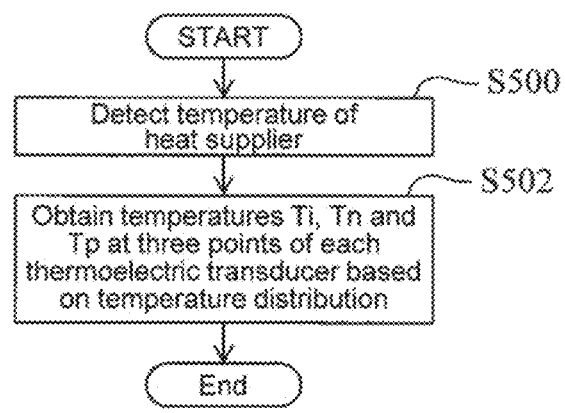
FIG. 15 is a flow chart that illustrates an example of a sub routine of a temperature acquisition process of the thermoelectric transducer according to the fifth embodiment of the present disclosure.

In the sub routine shown in FIG. 15, first, the ECU 26 detects the temperatures at three-points of the heat supplier (that is, the wall 22a of the easing 22) by means of the temperature sensors 52 (step S500). The graph located on the lower side in FIG. 14 indicates a relationship between the temperature at each portion of the individual unit stacks 18a and a distance L2 from one end face of the unit stack 18a in the row direction D1 of the unit stack 18a. Circles in FIG. 14 indicate the temperatures of the unit stack 18a at locations that are the same as the locations of the temperature sensors 52.

In the present embodiment, the difference in temperature between the locations of the temperature sensors 52 and the portions of the unit stack 18a which are equal in the distance L2 from the row direction D1 is considered as zero, as an example. That is, it is estimated that the temperatures of the unit stack 38a indicated by the circles in the graph are the same as the detection values of the temperature sensors 52 at the locations which are equal in the distance L2. Therefore, by obtaining the detection values of three temperature sensors 52, the temperatures of individual portions other than the temperatures at the three circles in the row direction D1 (that is, the temperature distribution of the unit stack 18a) can be grasped on the basis of these detection values as shown by the broken line in FIG. 14.

The ECU 26 executes the processing of step S502 following the processing of step S500. In step S502, the temperatures Ti, Tn and Tp at three points of each thermoelectric transducer 12 of the individual unit stacks 18a (that is, the individual sets of thermoelectric transducers 12) are estimated on the basis of the above-identified temperature distribution as follows.

First, an estimation method of the temperatures Ti, Tn and Tp at three points of each thermoelectric transducer 12 of the unit stack 18a that is located below in FIG. 14 will be described. It is herein assumed that the temperature of the electrode 20 and the temperatures Tn and Tp of the end feces 12aes and 12bes that are adjacent to the electrode 20 are treated as a same value, as already described in the first embodiment. Of the temperatures Ti, Tn and Tp at three points of each thermoelectric transducer 12, squares in FIG. 14 correspond to temperatures other than those of the circles. By calculating an approximate curve of the temperature distribution (see the broken line in FIG. 4) with a known manner, the temperatures indicated by the squares can be estimated using the approximate curve and the distance L2.

Moreover, as an example, in tins step S502, the temperatures Ti, Tn and Tp at three points of each thermoelectric transducer 12 of the remaining unit stacks 18a that are located on the upper side and centrally in FIG. 14 are estimated as follows. That is, in the present embodiment, the wall 22a of the casing 22 in which the thermal conductivity is uniform is used as a heat supplier. Thus, it is conceivable that the temperature of the wall 22a is even without depending on the locations in a direction in which three unit stacks 18a are arranged (that is, the direction D2 perpendicular to the row direction D1). Thus, it can be said that the conditions of thermal conduction from the wall 22a (the heat supplier) of the casing 22 to each unit stack 18a are equal to each other.

Accordingly, in this step S502, it is estimated that the temperatures (Ti, Tn and Tp) at positions in the row direction D1 of the unit stacks 18a that are located on the upper side and centrally in FIG. 14 are the same as the temperatures at the same positions in the row direction D1 of the unit stack 18a that is located on the lower side in FIG. 14. However, in an example where a heat supplier in which the conditions of thermal conduction are different from each other depending on the positions in the direction D2 is used, a smaller number of temperature sensors as compared with the number that is less than the total number of the temperatures Ti, Tn and Tp a t three points of a set of thermoelectric transducers 12 may be, for example, pro vided for each unit stack 18a (that is, for each set of thermoelectric transducers 12), and a temperature estimation according to the present embodiment may be, for example, performed for each unit stack 18a.

According to the malfunction detection device 50 of the present embodiment described so far, the temperatures Ti, Tn and Tp at three points of each thermoelectric transducer 12 can be obtained while decreasing the number of the temperature sensors 52 as compared with the malfunction detection device 40 according to the first embodiment that includes a plurality of temperature sensors 34.

Additionally, in contrast to the configuration of the thermoelectric transducer module 14 shown in FIG. 14, in an example in which a thermoelectric transducer module without the casing 22 is used, a plural sets of thermoelectric transducers 12 are arranged directly on the outer surface 16a of the exhaust pipe 16. In this example, the exhaust pipe 16 corresponds to the "heat supplier" described above.

Additionally, in the fifth embodiment described above, the processor 26b of the ECU 26 that is programmed to execute the processing of steps S500 and S502 corresponds to the "processor" according to the present disclosure.

Sixth Embodiment

Next, a sixth embodiment according to the present disclosure will be described with reference to FIGS. 16 to 19.
[Configuration of Power Generator According to Sixth Embodiment]

Figure 16:
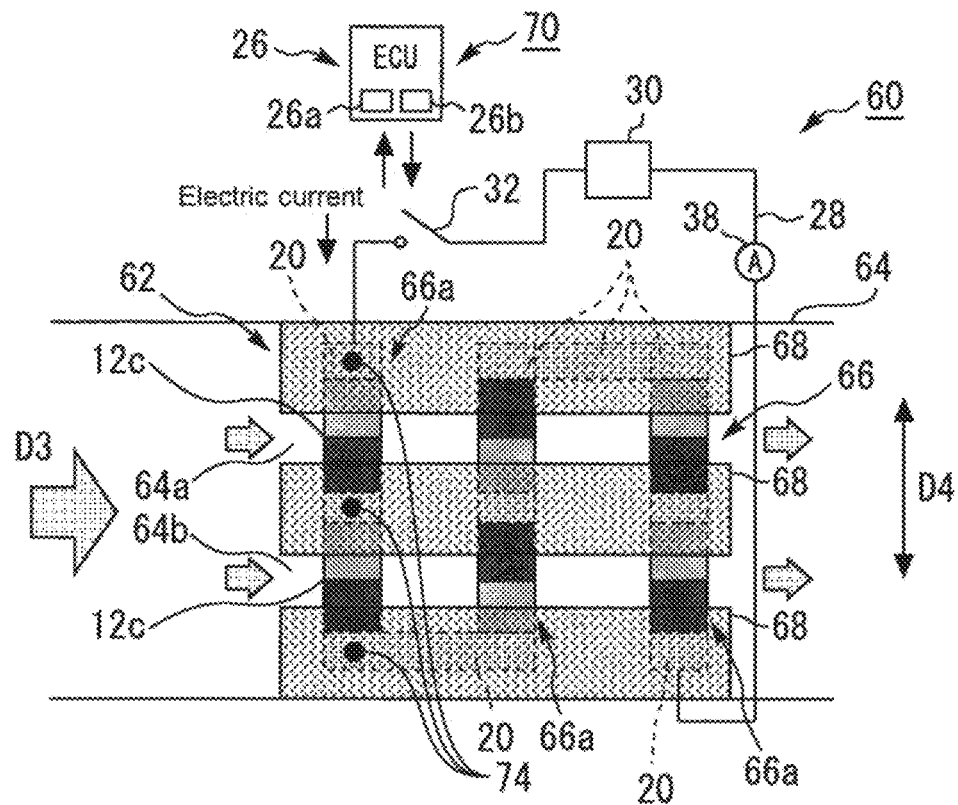
FIG. 16 is a schematic diagram that illustrates a configuration of a power generator and a malfunction detection device thereof according to a sixth embodiment of the present disclosure.
Figure 17:
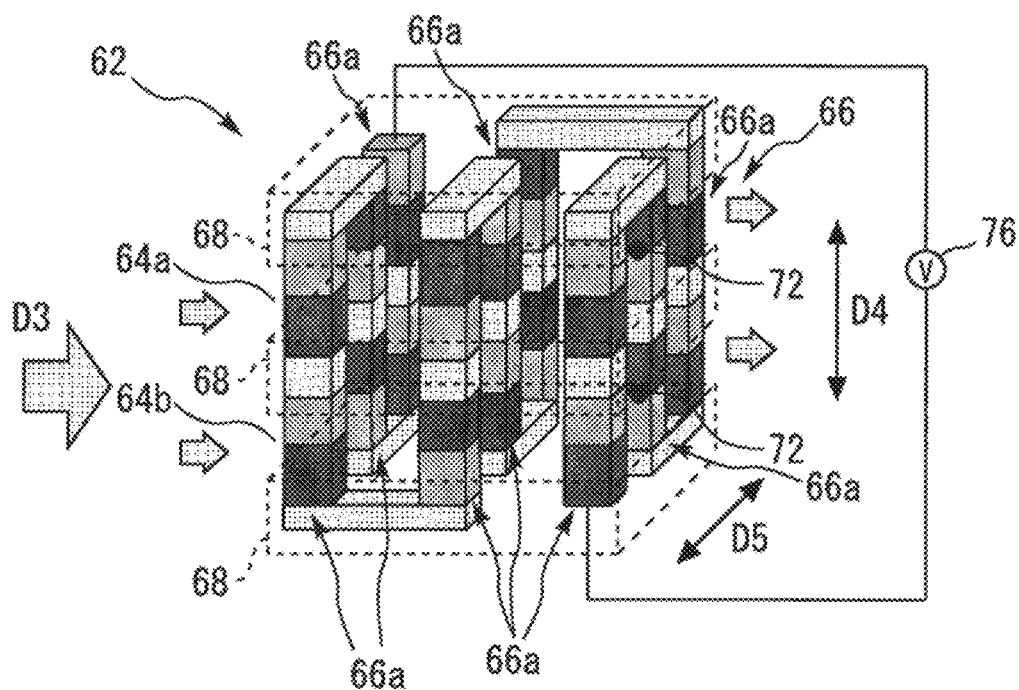
FIG. 17 is a perspective view that schematically illustrates a configuration of a transducer stack shown in FIG. 16.

FIG. 16 is a schematic diagram that illustrates a configuration of a power generator 60 and a malfunction detection device 70 thereof according to the sixth embodiment of the present disclosure. FIG. 17 is a perspective view that schematically illustrates a configuration of a transducer stack 66 shown in FIG. 16. In addition, in FIGS. 16 and 17, elements that are the same as constituent elements illustrated in FIGS. 4 and 5 described above are denoted by the same reference symbols, and a description of those elements is omitted or simplified hereunder.

As shown in FIG. 16, a thermoelectric transducer module 62 of the power generator 60 is arranged in an exhaust gas flow channel 64 through which an exhaust heat recovery fluid (as an example, exhaust gas) that recovers exhaust heat from a heat generating apparatus (as an example, internal combustion engine) flows. The thermoelectric transducer module 62 is provided with the transducer stack 66 and shields 68. In addition, although the exhaust heat recovery fluid is not particularly limited, in an example in which the internal combustion engine is a heat generating apparatus, a fluid other than the exhaust gas, such as a cooling water for cooling the internal combustion engine or an oil for lubricating the internal combustion engine, corresponds to the exhaust heat recovery fluid.

Each of the shields 68 has not only the following function that ensures a concentrated input of heat into the intrinsic semiconductor part 12c but also a function as a "flow channel formation member" of the exhaust gas flow channel 64. To be more specific, the exhaust gas flow channel 64 is provided with a plurality of (as an example, two) unit flow channels 64a and 64b that are zoned by three plate-like shields 68 such that exhaust gases flow in parallel. Each of the shields 68 has a thermal conductivity that is lower than that of the thermoelectric transducer 12. The shields 68 can be, for example, made of ceramics.

As shown in FIG. 16, the transducer stack 66 is provided with plural sets of (as an example, nine) thermoelectric transducers 12, each set of which has a plurality of (in the example shown in FIG. 16, two) thermoelectric transducers 12 that are arranged so as to be along a direction D4 perpendicular to a direction D3 that is an extension direction of the unit flow channels 64a and 64b (in other words, the flow direction of the exhaust gas) and to across two unit flow channels 64a and 64b. This one set of thermoelectric transducers 12 is, herein, also referred to as a "unit stack 66a". In the individual unit stacks 66a of the present embodiment, two thermoelectric transducers 12 are connected to each other in series with the electrode 20 interposed therebetween.

In more detail, in the transducer stack 66, as an example, nine unit stacks 66a are arranged so as to be spaced by a predetermined distance from each other along each of the extension direction D3 of the unit flow channels 64a and 64b and a direction D5 (which is a direction perpendicular to both of the directions D3 and D4) as shown in FIGS. 16 and 17.

As shown in FIGS. 16 and 17, each of the nine sets of thermoelectric transducers 12 is covered by the shields (that is, the flow channel formation members) 68 while each surface of the intrinsic semiconductor parts 12c is exposed to the exhaust gas. According to the principle of power generation of the thermoelectric transducer 12, the electromotive voltage Vt can be generated effectively by promoting an input of heat into the intrinsic semiconductor part 12c at which the band gap energy is the lowest as compared with inputs of heat into the end portions 12ae and 12be (see FIG. 1) at which the band gap energy is the highest. According to the shields 68 whose thermal conductivity is low, heat from the exhaust gas can be prevented from being transferred to the end portions 12ae and 12be. Thus, since a part of each thermoelectric transducer 12 is covered by the corresponding shield 68 in a manner described above, a concentrated input of heat into each intrinsic semiconductor part 12c can be achieved and, as a result, the power generation can be performed effectively.

[Configuration of Malfunction Detection Device according to Sixth Embodiment]

The malfunction detection device 70 of the present embodiment is provided with the ECU 26, a plurality of temperature sensors 72 and 74, an electric voltage sensor 76 and the electric current sensor 38 (see FIG. 5). The temperature sensors 72 are distributed one by one to each of the unit flow channels 64a and 64b to detect the temperatures Ti of the intrinsic semiconductor parts 12c. That is, each of the temperature sensors 72a corresponds to the "intrinsic portion temperature" according to the present disclosure. In the example shown in FIG. 17, the temperature sensors 72 are attached to the respective thermoelectric transducers 12 pertaining to a set of the nine sets of thermoelectric transducers 12 which is located on the most downstream side of each of the unit flow channels 64a and 64b (as an example, a set which is located centrally in the direction D5).

The temperature sensors 74 are distributed one by one to each of three shields 68 to detect the temperatures Tn and Tp of the thermoelectric transducers 12 as shown in FIG. 16. That is, the temperature sensors 74 correspond to the "end portion temperature sensor" according to the present disclosure. In more detail, as an example, three temperature sensors 74 are attached to the respective electrodes 20 that are connected to one set of the thermoelectric transducers 12 of three sets of thermoelectric transducers 12 located on the upstream side in the flow direction D3 of the exhaust gas. Moreover, in the present embodiment, the electric voltage sensor 76 is configured, as shown in FIG. 17, so as to detect the electric voltage at the both ends of the transducer stack 66 in order to detect the actual electromotive voltage Vma of the thermoelectric transducer module 62. In addition, in an example in which the actual electromotive voltage Vta is detected for each thermoelectric transducer 12, an electric voltage sensor may be provided for each thermoelectric transducer 12.

[Estimation Method of Temperatures Ti, Tn and Tp at Three Points of Thermoelectric Transducer according to Sixth Embodiment]

First, the temperature Ti of the intrinsic semiconductor part 12c is detected or estimated for each of the unit flow channels 64a and 64b by means of the temperature sensors 72. To be more specific, with respect to acquisition of the temperatures Ti of two thermoelectric transducers 12 to which the temperature sensors 72 are attached, the detection values of the temperature sensors 72 are used. On the other hand, the temperatures Ti of the thermoelectric transducers 12 other than these two thermoelectric transducers 12 are estimated as follows. That is, it is estimated that the temperature Ti of each intrinsic semiconductor part 12c located so as to be exposed to the unit flow channel 64a is the same as the detection value of the corresponding temperature sensor 72 arranged in the same unit flow channel 64a. Moreover, estimation for the unit flow channel 64b is similarly performed.

In the configuration of the thermoelectric transducer module 62 shown in FIGS. 16 and 17, the end faces 12aes and 12bes of each thermoelectric transducer 12 are covered by the shields 68. In the ECU 26, with respect to the temperature sensor 74 and the end faces 12aes and 12bes that are located in the same shield 68, information that indicates a temperature difference between the temperature at the location of the temperature sensor 74 and the temperature at the location of each of the end faces 12aes and 12bes are stored as a map (not shown). This temperature difference changes depending on the amount of heat input into the shield 68. The temperature detected by the temperature sensor 74 shows a change according to this change of the amount of the heat input. Therefore, in the map described above, a relationship between the detection temperature of the temperature sensor 74 and the temperature difference is defined, in advance, using the determination temperature as a parameter. In the present embodiment, as an example, the temperatures Tn and Tp of the end faces 12aes and 12bes are estimated on the basis of the detection temperature of the temperature sensor 74 with reference to this kind of map.

The estimation method of the temperatures Ti, Tn and Tp at three points of the thermoelectric transducer 12 according to the present embodiment described so far can be, for example, used for the processing of step S100 or S300 in the routines shown in FIGS. 9, 10, 12 and 13 described in the first to fourth embodiments.

[Problem on Thermoelectric Transducer Module Arranged in Flow Channel and Advantageous Effects of Configuration according to Sixth Embodiment]

Figure 18:
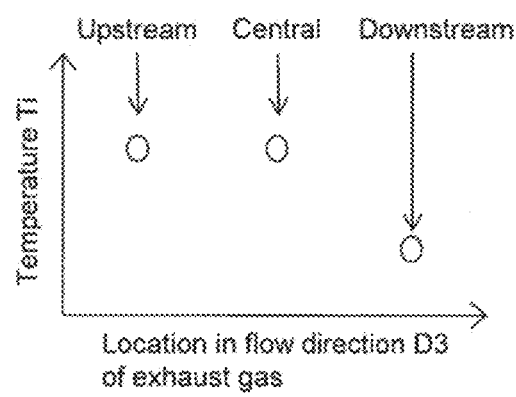
FIG. 18 is a graph for describing temperatures Ti of three thermoelectric transducers located in a unit channel, of three sets of thermoelectric transducers whose locations in a direction D5 shown in FIG. 17 are the same as each other and which are arranged along a flow direction D3 of exhaust gas.

FIG. 18 is a graph for describing the temperatures Ti of three thermoelectric transducers 12 located in the unit channel 64b, of three sets of thermoelectric transducers 12 whose locations in the direction D5 shown in FIG. 17 are the same as each other and which are arranged along the flow direction D3 of the exhaust gas. FIG. 18 represents an example in which clogging by foreign matter has occurred at a portion of the unit channel 64b between the central thermoelectric transducer 12 and the thermoelectric transducer 12 located on the downstream side thereof in the flow direction D3 of the exhaust gas (that is, the extension direction of the unit channels 64a and 64b).

If the clogging described above occurs at the unit channel 64b, the flow of the exhaust gas passing through the periphery of the thermoelectric transducer 12 located on the downstream side stops. Thus, in the unit flow channel 64b, the exhaust gas go toward the central thermoelectric transducer 12 from the upstream side, and flows back into the upstream side due to a reverse of the flow direction thereafter. As a result, as shown in FIG. 18, a condition in which the temperature Ti of the thermoelectric transducer 12 located on the downstream side does not increase may occur. Consequently, a condition in which the actual electromotive voltage Vta of this thermoelectric transducer 12 does not increase may occur.

Figure 19:
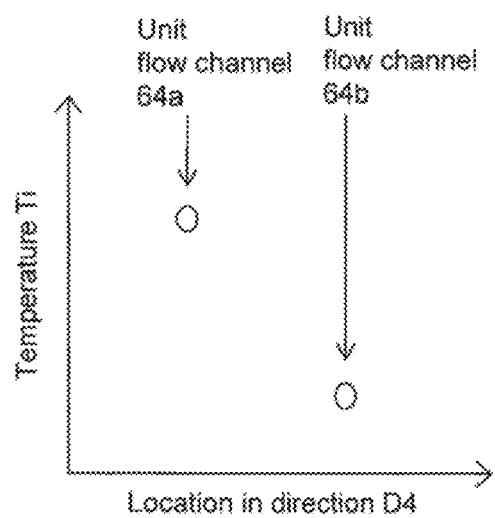
FIG. 19 is a graph for describing the temperatures Ti of two thermoelectric transducers located on the most upstream side in each of the unit flow channels, of three sets of thermoelectric transducers whose locations in the direction D5 shown is FIG. 17 are the same as each other and which are arranged along the flow direction D3 of the exhaust gas.

FIG. 19 is a graph for describing the temperatures Ti of two thermoelectric transducers 12 located on the most upstream side in each of the unit flow channels 64a and 64b, of three sets of thermoelectric transducers 12 whose locations in the direction D5 shown in FIG. 17 are the same as each other and which are arranged along the flow direction D3 of the exhaust gas. FIG. 19 represents an example in which clogging by foreign matter has occurred in the vicinity of the inlet of the unit flow channel 64b. In this example, as shown in FIG. 19, a condition in which the temperature Ti of the thermoelectric transducer 12 of the unit flow channel 64b in which the clogging has occurred does not increase as compared with the temperature Ti of the other unit flow channel 64a may occur. As a result, a condition in which the actual electromotive voltage Vta of this thermoelectric transducer 12 does not increase may occur. This also applies to not only the thermoelectric transducer 12 located on the most upstream side but also the temperatures Ti of the thermoelectric transducers 12 located centrally and on the most downstream side, in the unit flow channel 64b.

The temperatures Ti, Tn and Tp at three points of each thermoelectric transducer 12 of the thermoelectric transducer module 62 may be detected by means of as many temperature sensors as possible, and the number of temperatures that are estimated may be reduced. Thus, even if the clogging as shown in FIG. 18 or 19 has occurred, the accuracy of acquisition of the temperatures Ti, Tn and Tp at three points of each thermoelectric transducer 12 can be enhanced. On the other hand, if the number of temperature sensors that are mounted increases, the cost of a malfunction detection device will increase due to an increase of the number of its parts. Therefore, there is a request that decreases the number of temperature sensors while ensuring the accuracy of acquisition of the temperatures at three points described above.

With respect to the request described above, in the configuration of the present embodiment, the temperature sensors 72 that detect the temperature sensors Ti are distributed one by one to each of the unit flow channels 64a and 64b. Thus, it can be grasped that, by comparing the detection values of the temperature sensors 72 between the unit flow channels 64a and 64b, the clogging of one of the unit flow channels 64a and 64b has occurred as shown in FIG. 19. Therefore, when the clogging has not occurred, the temperatures Ti of the thermoelectric transducers 12 arranged in the individual unit flow channels 64a and 64b can be detected and estimated along with the reduction of the number of the temperature sensors 72, while grasping the presence or absence of occurrence of the clogging.

Furthermore, according to the configuration of the present embodiment, in response to the request described above, the temperature sensors 72 are attached to the thermoelectric transducers 12 located on the most downstream side of each of the unit flow channels 64a and 64b. In contrast to this kind of configuration, if these temperature sensors 72 are attached to the thermoelectric transducers 12 located on the upstream side, a change of the temperatures Ti of the thermoelectric transducers 12 located on the downstream side, due to the clogging cannot be grasped when the clogging as shown in FIG. 18 has occurred. However, according to the configuration of the present embodiment in which those temperature sensors 72a are attached to the thermoelectric transducers 12 located on the most downstream side of each of the unit flow channels 64a and 64b, an occurrence of the clogging in a manner as shown in FIG. 18 can be grasped by comparing the detection values of the temperature sensors 72 between the unit flow channels 64a and 64b. Therefore, when the clogging has not occurred, the temperatures Ti of the thermoelectric transducers 12 arranged in the individual unit flow channels 64a and 64b can be detected and estimated along with the reduction of the number of the temperature sensors 72, while grasping the presence or absence of occurrence of the clogging in this manner.

Additionally, in the sixth embodiment described above, as an example, the temperatures 72 are attached to each of the thermoelectric transducers 12 of the sets that are located on the most downstream side of each of the unit flow channels 64a and 64b, of nine sets of thermoelectric transducers 12. However, the temperature sensors 72, that is, the "intrinsic portion temperatures" may be attached to not the sets located on the most downstream side of each of the unit flow channels 64a and 64b but each of thermoelectric transducers 12 of other sets (in the example shown in FIG. 17, the sets located on the most upstream side or centrally). Moreover, the intrinsic portion temperatures may be installed for a plurality of thermoelectric transducers 12 of each of the unit flow channels 64a and 64b, as far as the intrinsic portion temperatures are installed for one or some of the thermoelectric transducers 12 located in each of the unit flow channels 64a and 64b. Even in this kind of example, the number of the intrinsic portion temperatures can be reduced as compared with an example in which the intrinsic portion temperatures are installed for all the thermoelectric transducers 12 of each of the unit flow channels 64a and 64b.

Moreover, in the sixth embodiment described above, as an example, the shields 68 that correspond to the "flow channel formation member" for zoning the exhaust gas flow channel 64 are divided into three channels. However, the flow channel formation, member according to the present disclosure may be formed integrally. Furthermore, if the flow channel formation member that covers the end faces 12ae and 12be of each thermoelectric transducer 12 of the thermoelectric transducer module 62 is formed integrally (that is, as one member), the number of the temperature sensors 74 that each correspond to the "end portion temperature sensors" may be at least one.

Seventh Embodiment

Next, a seventh embodiment according to the present disclosure will be described with reference to FIGS. 20 to 22. A malfunction detection process according to the seventh embodiment is addressed to the power generator 60 as in the sixth embodiment. However, in the present embodiment, it is assumed that an electric voltage sensor is provided for each thermoelectric transducer 12 for the processing of step S610 described later.

[Malfunction Detection Device According to Seventh Embodiment]

Figure 20:
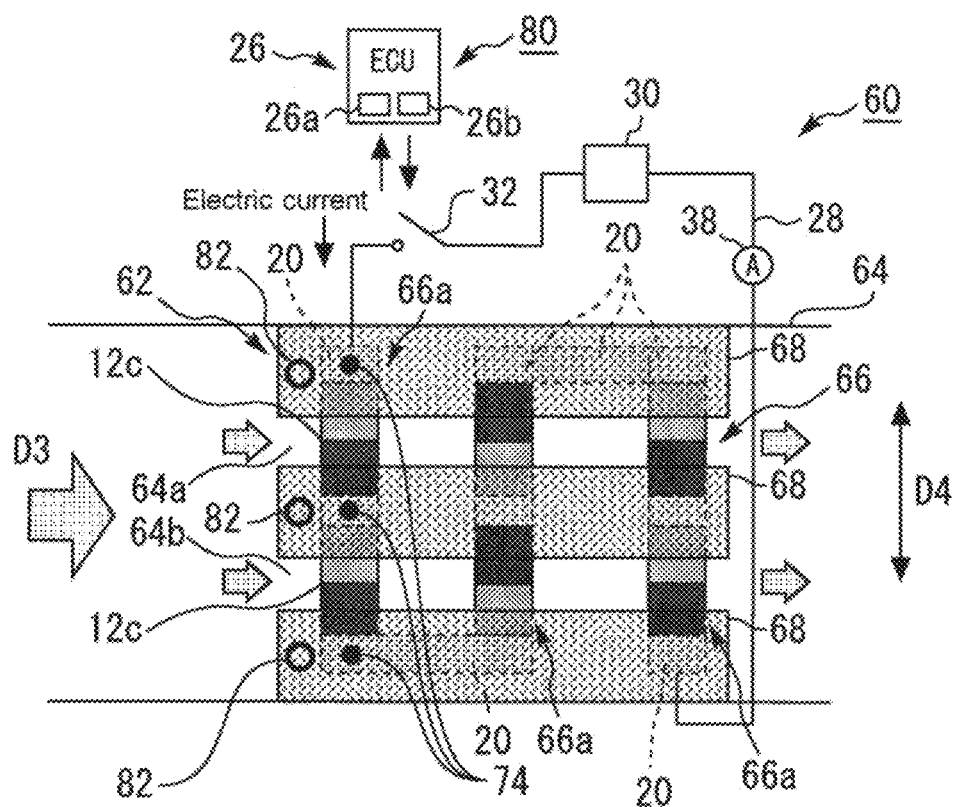
FIG. 20 is a diagram that illustrates a configuration of a malfunction detection device according to a seventh embodiment of the present disclosure.

FIG. 20 is a diagram that illustrates a configuration of a malfunction detection device 80 according to the seventh embodiment of the present disclosure. The malfunction detection device 80 according to the present embodiment is the same as the malfunction detection device 70 according to the sixth embodiment except for that a heater 82 is additionally provided. As shown in FIG. 20, the heater 82 is installed, inside each of the shields 68, in the vicinity of the end portion on the upstream side in the flow direction D3 of the exhaust gas as an example. The energization to the heater 82 is controlled by the ECU 26.

[Concrete Malfunction Detection Process According to Seventh Embodiment]

In a configuration m which, as with the configuration shown in FIG. 20, a thermoelectric transducer module is arranged in a flow channel through which an exhaust heat recovery fluid flows, the number of factors that act, as a disturbance, on a malfunction detection, of a power generator become greater as compared with a configuration in which a thermoelectric transducer module is arranged on a solid heat source (that is, exhaust pipe 16) as with the configuration shown in FIG. 4. Specifically, if a thermoelectric transducer module is arranged in a flow channel, the thermoelectric transducer module is affected by the disturbance, such as clogging of a flow channel, or variation in temperature or velocity of a fluid that passes through the periphery of each thermoelectric transducer.

In the present embodiment, by adopting a manner described below, the malfunction detection of the power generator 60 is performed while distinguishing the factors of malfunction. In detail, malfunction of the thermoelectric transducer module 14 (that is, malfunction of the individual thermoelectric transducers 12) and malfunction of the unit channels 64a and 64b are distinguished from each other. Moreover, it is also determined whether or not there is a malfunction concerning the temperature detection for the malfunction detection of the power generator 60.

Figure 21:
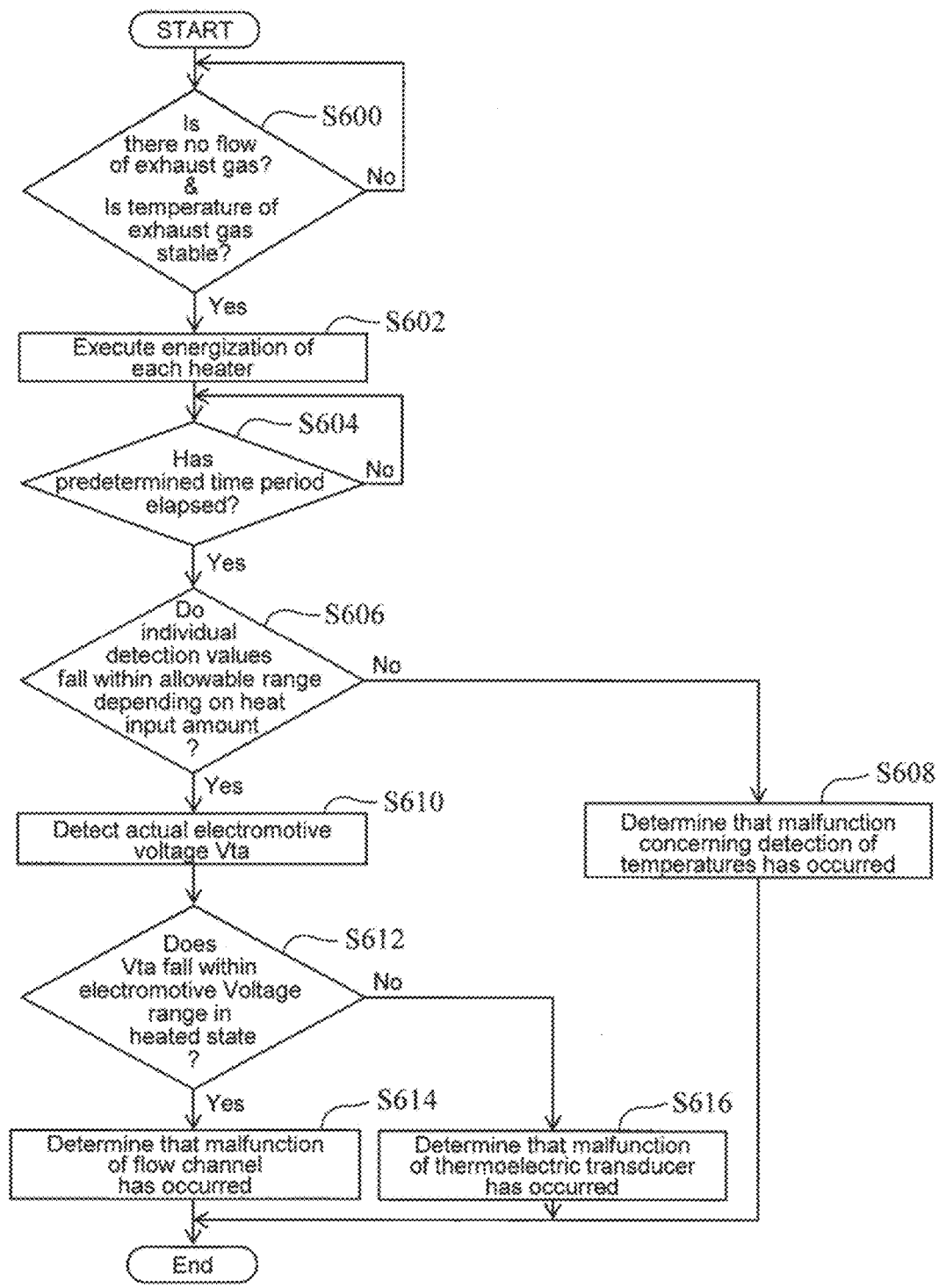
FIG. 21 is a flowchart that illustrates an example of a routine of a malfunction detection process according to the seventh embodiment of the present disclosure.

FIG. 21 is a flow chart that illustrates an example of a routine of a malfunction detection process according to the seventh embodiment of the present disclosure. In the present embodiment, prior to execution of the routine shown in FIG. 21, a routine similar to the routine shown in FIG. 9 (hereafter, referred to as a "routine R" for convenience of explanation) is executed in order to detect the presence or absence of malfunction of the individual thermoelectric transducers 12 of the thermoelectric transducer module 62.

According to the routine R described above, the malfunction determination of the power generator 60 is performed under a condition in which there is an exhaust gas flow and in which the thermoelectric transducer module 62 has a temperature at which power generation can be performed as a result of a supply of heat from the exhaust gas. In addition, as a manner of obtaining the temperatures Ti, Tn and Tp at three points used to calculate the estimated electromotive voltage Vte in step S102 of the routine R, the manner described in the sixth embodiment can be used. The routine shown in FIG. 21 is started up when a malfunction of the thermoelectric transducer 12 is detected in step S110 of the routine R.

In the routine shown in FIG. 21, first, the ECU 26 determines-whether a condition is met in which there is no flow of the exhaust gas (that is, an exhaust heat recovery fluid) and in which the temperature of the exhaust gas that remains in the exhaust gas flow channel 64 is stable (step S600). This kind of condition is met, for example, when a predetermined time period elapses after the internal combustion engine stops operating. Thus, in step S600, it is determined whether or not this kind of predetermined time period has elapsed after the internal combustion engine stops operating. This determination is performed repeatedly until the result of the determination becomes positive after the start-up of the present routine. In addition, if the internal combustion engine restarts without elapse of this kind of predetermined time period, the current processing of the routine is ended.

If the result of determination in step S600 is positive, the ECU 26 executes the energization to each heater 82 (step S602). If each heater 82 is energized, heat is transferred in the shield 68. This heat is also transferred to each of the thermoelectric transducers 12 from the shield 68. The power consumption of each heater 82 is determined so as to be able to control the temperature of each of the thermoelectric transducers 12 within the temperature range (see FIG. 3) in which the electromotive voltage Vt can be generated. As an example, the power consumption may be determined such that each of the thermoelectric transducers 12 is heated so as to have a temperature equivalent to the temperature T1 shown in FIG. 3. Thus, if the thermoelectric transducer 12 is normal, an actual electromotive voltage Vta equivalent to the peak value can be generated. Since a value that is used for the determination becomes greater, the determination can be performed accurately.

Next, the ECU 26 determines whether or not a predetermined time period from a start of energization to each heater 82 has elapsed (step S604). This predetermined time period is set in advance as a time period that is required until the temperatures of each shield 68 and each thermoelectric transducer 12 become stable after the energization to each heater 82 is started.

After the predetermined time period of step S604 has elapsed, the ECU 26 determines whether or not individual detection values of the temperature sensors 72 and 74 that are used for detection or estimation of the temperatures Ti, Tn and Tp at three points of the thermoelectric transducer 12 that is subject to determination fall within an allowable range depending on the amount of heat inputted by heating with each heater 82 (step S606).

Figure 22:
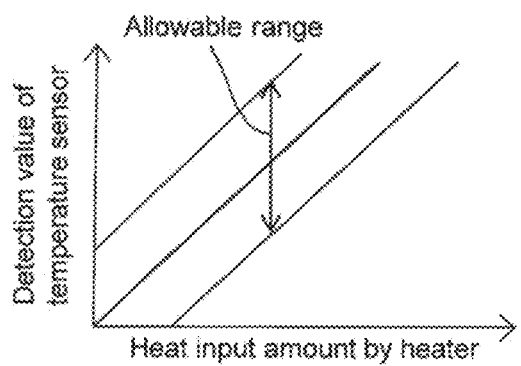
FIG. 22 is a graph that illustrates a relationship between a detection value of a temperature sensor and a heat input amount by a heater.

FIG. 22 is a graph that illustrates a relationship between the detection value of the temperature sensor and the heat input amount by the heater 82. As shown in FIG. 22, if the heat input amount becomes greater, the detection value of the temperature sensor also increases. The heat input amount to the thermoelectric transducer module 62 (that is, the thermoelectric transducers 12 and the shield 68) by each of three heaters 82 can be calculated on the basis of the power consumption of the heater 82. A variation in the detection value of each of temperature sensors 72 and 74 when heat is inputted by the heater 82 differs depending on the position of the temperature sensor 72 or 74. Thus, a map that defines the relationship shown in FIG. 22 is stored in the ECU 26 for each of the temperature sensors 72 and 74. In this step S606, it is determined, with referring to the map as described above for each of the temperature sensors 72 and 74 that is subject to determination, whether or not the temperature detection value falls within the allowable range. In addition, in order to improve the accuracy of determination, this kind of determination may be performed with taking, as an object, a plurality of temperature detection values while changing the heat input amount.

If the result of determination in step S606 is negative, that is, if at least one of the detection values of the temperature sensors 72 and 74 is deviated from the allowable range, the ECU 26 determines that a malfunction concerning detection of the temperatures Ti, Tn or Tp has occurred (step S608). Additionally, by determining which temperature sensor of the temperature sensors 72 and 74 has a detection value that has been deviated from the allowable range, malfunction concerning detection of the temperature Ti and malfunction concerning detection of temperature Tn or Tp can be distinguished from each other.

If on the other hand, the result of determination in step S606 is positive, the ECU 26 detects the actual electromotive voltage Vta of the thermoelectric transducer 12 that is subject to determination (step S610). The actual electromotive voltage Vta can be, for example, detected using an electric voltage sensor with the switch 32 open (step S610).

Next, the ECU 26 determines whether or not the actual electromotive voltage Vta falls within an electromotive voltage estimation range of the thermoelectric transducer 12 in a heated state in which heating by the heater 82 is performed (which corresponds to an example of the "temperature adjustment state" according to the present disclosure) (step S612). The electromotive voltage estimation range that is determined with taking into consideration the power consumption of the heater 82 used for the processing of step S602 is stored in the ECU 26.

If the result of the determination in step S612 is positive, that is, if the actual electromotive voltage Vta falls within the electromotive voltage estimation range described above, the ECU 26 determines that a malfunction has not occurred at the thermoelectric transducer 12 that is subject to determination and that a malfunction of the power generator 60 (see step S110) is thus caused by a malfunction of the unit flow channel 64a or 64b (step S614).

If, on the other hand, the result of the determination in step S612 is negative, that is, if the actual electromotive voltage Vta is deviated from the electromotive voltage estimation range described above, the ECU 26 determines that the malfunction of the power generator 60 (see step S110) is caused by a malfunction of the thermoelectric transducer 12 that is currently subject to determination (step S616).

According to the routine shown in FIG. 21 described so far, the actual electromotive voltage Vta is evaluated in a state in which there is no flow of the exhaust gas and in a heated state in which heating by the heaters 82 are performed. Thus, the malfunction detection can be performed while sufficiently eliminating the disturbance with respect to the malfunction detection of the power generator 60.

Moreover, according to the routine shown in FIG. 21, if there is no malfunction concerning the temperature detection (if the result of determination in step S606 is positive) and if the actual electromotive voltage Vta falls within the electromotive voltage estimation range, it is determined that the cause of malfunction of the power generator 60 is a malfunction of the unit flow channel 64a or 64b. That is, if the actual electromotive voltage Vta is determined to be normal (step S614) in a state in which the effect of an exhaust gas flow is eliminated even when the actual electromotive voltage Vta is determined to be abnormal (step S110) in the routine R in a state in which there is an exhaust gas flow, it is conceivable that there is no malfunction concerning the thermoelectric transducer 12 itself. Therefore, it can be judged that the unit flow channel 64a or 64b is the cause of the malfunction. On the other hand, if the actual electromotive voltage Vta is determined to be abnormal (step S616) even in a state in which the effect of an exhaust gas flow is eliminated in the routine shown in FIG. 21, it is conceivable that the thermoelectric transducer 12 is the cause of the malfunction. Therefore, it can be judged that the thermoelectric transducer module 14 (in more detail, the thermoelectric transducer 12 that is subject to determination) is the cause of the malfunction.

As described above, according to the malfunction detection process of the present embodiment, the malfunction detection of the power generator 60 can be performed while distinguishing the cause of malfunction. Moreover, according to the determination in step S606, it can also be determined whether or not there is a malfunction concerning the temperature detection performed for foe malfunction detection of the power generator 60. In more detail, in the present embodiment, if it is determined that there is a malfunction concerning the temperature detection, the ECU 26 detect, without distinguishing the cause of malfunction of the power generator 60 in step S110 in the routine R, that there is both of malfunction concerning the power generator 60 and malfunction concerning the temperature detection.

Additionally, in the seventh embodiment, the example in which the processing of the routine shown in FIG. 21 for distinguishing the cause of malfunction is performed along with the processing of the routine R (which is a routine similar to the routine shown in FIG. 9) that compares the estimated electromotive voltage Vte with the actual electromotive voltage Vta (the example in which determination is performed on a transducer-to-transducer basis) has been described. However, if the determination is performed on a transducer-to-transducer basis, the processing of the routine shown in FIG. 21 may be appropriately corrected in order to distinguish the cause of malfunction by combining with the processing of the routine shown in FIG. 10 that compares the estimated generated electric power Pte and the actual generated electric power Pta. Furthermore, the processing of the routine shown in FIG. 21 may be appropriately corrected in order to distinguish the cause of malfunction by combining with the processing of the routine shown in FIG. 12 that compares the estimated electromotive voltage Vme and the actual electromotive voltage Vma (or the processing of the routine shown in FIG. 13 that compares the estimated generated electric power Pme and the actual generated electric power Pma) on the module basis. In addition, if the generated electric power Pt or Pm is used, it may be determined whether or not the actual generated electric power Pta or the actual generated electric power Pma fells within a "generated electric power estimation range" of the thermoelectric transducer 12 or the thermoelectric transducer module 62 in a heated condition.

Moreover, in the seventh embodiment, the example in which the heater 82 is used as the "temperature adjuster" according to the present disclosure has been described. However, a cooler may be used instead of a heater as the temperature adjuster according to the present disclosure, as far as it can be cooled stably at a certain temperature within a temperature range in which the thermoelectric transducer 32 that is subject to determination can generate the electromotive voltage Vt. In addition, if a cooler is used, it may be determined, in a temperature adjustment state (that is, a cooled state in which cooling is performed stably), that a malfunction concerning the detection of the temperature Ti has occurred when at least one of detection values of the temperature sensors 72 is deviated from the allowable range according to a heat release amount by the cooling by the cooler. Similarly, if at least one of detection values of the temperature sensors 74 is deviated from the allowable range described above, it may be determined that a malfunction concerning the detection of the temperatures Tn and Tp has occurred.

Additionally, in the seventh embodiment described above, the processor 26b of the ECU 26 that is programmed to execute a series of processing shown in FIG. 21 corresponds to the "processor" according to the present disclosure.

The embodiments and modifications described above may be combined in other ways than those explicitly described above as required and may be modified in various ways without departing from the scope of the present disclosure.

What is claimed is:

1. A malfunction detection device for performing a malfunction detection of a power generator, the power generator including:

a thermoelectric transducer module that is arranged at a portion to which exhaust heat from a heat generating apparatus is transferred, and that includes, as at least one thermoelectric transducer, at least one semiconductor single crystal including an n-type semiconductor part, a p-type semiconductor part and an intrinsic semiconductor part located between the n-type semiconductor part and the p-type semiconductor part, a band gap energy of the intrinsic semiconductor part being lower than respective band gap energies of the n-type semiconductor part and the p-type semiconductor part; and a load device that is included in an electric circuit along with the thermoelectric transducer module, wherein the malfunction detection device performs the malfunction detection for at least one of the at least one thermoelectric transducer on a transducer basis, or performs the malfunction detection for the whole thermoelectric transducer module on the module basis, the malfunction detection device comprising a processor the processor being programmed to:

detect or estimate, using one or more temperature sensors, an n-type end portion temperature that is a temperature of an end portion of the n-type semiconductor part on an opposite side to the intrinsic semiconductor part, a p-type end portion temperature that is a temperature of an end portion of the p-type semiconductor part on an opposite side to the intrinsic semiconductor part, and an intrinsic portion temperature that is a temperature of the intrinsic semiconductor part, with respect to one or a plurality of thermoelectric transducers that are subject to the malfunction detection;

calculate at least one of an estimated electromotive voltage and an estimated generated electric power based on the estimated electromotive voltage on the transducer basis or the module basis, based on the n-type end portion temperature, the p-type end portion temperature and the intrinsic portion temperature that are detected or estimated;

detect, using one or more sensors, at least one of an actual electromotive voltage and an actual generated electric power on the transducer basis or the module basis; and perform, on the transducer basis or the module basis, at least one of a first determination as to whether or not a degree of deviation of the actual electromotive voltage with respect to the estimated electromotive voltage is greater than or equal to a first threshold value, and a second determination, as to whether or not a degree of deviation of the actual generated electric power with respect to the estimated generated electric power is greater than or equal to a second threshold value, and to detect a malfunction of the power generator in response to a result of at least one of the first determination and the second determination being positive.

2. The malfunction detection device for the power generator according to claim 1, wherein the thermoelectric transducer module is arranged at a surface of a heat supplier that transfers exhaust heat from the heat generating apparatus, wherein the at least one thermoelectric transducer includes one set of thermoelectric transducers that are arranged in a row on the surface of the heat supplier, wherein the one or more temperature sensors include a plurality of temperature sensors whose number are less than a total number of the n-type end portion temperature, the p-type end portion temperature and the intrinsic portion temperature of the one set of thermoelectric transducers, and which are attached to the heat supplier in such a manner as to be spaced by a predetermined distance from each other and be arranged along a direction parallel to the row, and wherein the processor is programmed to estimate each n-type end portion temperature, each p-type end portion temperature and each intrinsic portion temperature of the one set of thermoelectric transducers, based on a temperature distribution of the one set of thermoelectric transducers based on detection values of the plurality of temperature sensors.

3. The malfunction detection device for the power generator according to claim 1, wherein the portion to which exhaust heat from the heat generating apparatus is transferred is a flow channel through which an exhaust heat recovery fluid that recovers exhaust heat from the heat generating apparatus flows, wherein the thermoelectric transducer module includes a flow channel formation member that zones the flow channel such that a plurality of unit flow channels through which the exhaust heat recovery fluid flows in parallel are formed, wherein the flow channel formation member has a thermal conductivity that is lower than a thermal conductivity of the at least one thermoelectric transducer of the thermoelectric transducer module, wherein the at least one thermoelectric transducer of the thermoelectric transducer module includes plural sets of thermoelectric transducers, each set of which has a plurality of thermoelectric transducers that are arranged so as to be along a direction perpendicular to an extension direction of the plurality of unit flow channels and to across the plurality of unit flow channels, wherein each thermoelectric transducer of the plural sets of thermoelectric transducers is covered by the flow channel formation member while a surface of the intrinsic semiconductor part of the each thermoelectric transducer is exposed to the exhaust heat recovery fluid, wherein the one or more temperature sensors include:

a plurality of intrinsic portion temperature sensors configured to detect temperatures of respective intrinsic semiconductor parts of a part of thermoelectric transducers of a plurality of thermoelectric transducers located in each unit flow channel of the plurality of unit flow channels; and one or a plurality of end portion temperature sensors that are arranged at the flow channel formation member, wherein the processor is programmed to:

detect or estimate, for each unit flow channel, each intrinsic portion temperature of the plural sets of thermoelectric transducers, based on detection values of the plurality of intrinsic portion temperature sensors, and detect or estimate each n-type end portion temperature and each p-type end portion temperature of the plural sets of thermoelectric transducers, based on detection values of the one or a plurality of end portion temperature sensors.

4. The malfunction detection device for the power generator according to claim 3, wherein the plurality of intrinsic portion temperature sensors are distributed one by one to the plurality of unit flow channels and are attached to each thermoelectric transducer of a set of thermoelectric transducers located on a most downstream side of the plurality of unit flow channels, of the plural sets of thermoelectric transducers.

5. The malfunction detection device for the power generator according to claim 3,
wherein the malfunction detection device further comprises a temperature adjuster configured to perform heating or cooling of the flow channel formation member to adjust a temperature of the one or a plurality of end portion temperature sensors within a temperature range in which one or a plurality of thermoelectric transducers that are subject to the malfunction detection are able to generate an electromotive voltage,
wherein the processor is programmed to:
after detecting the malfunction of the power generator in response to a result of at least one of the first determination and the second determination being positive, perform the heating or the cooling by the temperature adjuster in a condition in which there is no flow of the exhaust heat recovery fluid and in which a temperature of the exhaust heat recovery fluid is stable;
in response to the actual electromotive voltage deviating from an electromotive voltage estimation range of the one or a plurality of thermoelectric transducers in a temperature adjustment state in which the heating or the cooling by the temperature adjuster is performed or in response to the actual generated electric power deviating from a generated electric power estimation range of the one or a plurality of thermoelectric transducers in the temperature adjustment state, determine that the malfunction of the power generator is caused by a malfunction of the thermoelectric transducer module; and
in response to the actual electromotive voltage falling within the electromotive voltage estimation range or in response to the actual generated electric power falling within the generated electric power estimation range, determine that the malfunction of the power generator is caused by a malfunction of the flow channel.

6. The malfunction detection device for the power generator according to claim 5,
wherein the processor is programmed, in response to at least one of detection values of the plurality of intrinsic portion temperature sensors deviating in the temperature adjustment state from an allowable range according to a heat input amount by the heating or a heat release amount by the cooling by the temperature adjuster, to determine that a malfunction concerning detection of the intrinsic portion temperature has occurred.

7. The malfunction detection device for the power generator according to claim 5,
wherein the processor is programmed, in response to at least one of detection values of the one or a plurality of end portion temperature sensors deviating in the temperature adjustment state from an allowable range according to a heat input amount by the heating or a heat release amount by the cooling by the temperature adjuster, to determine that a malfunction concerning detection of the n-type end portion temperature or the p-type end portion temperature has occurred.

* * * * *

UNITED STATES PATENT AND TRADEMARK OFFICE
CERTIFICATE OF CORRECTION

PATENT NO. : 10,454,011 B2
APPLICATION NO. : 15/863224
DATED : October 22, 2019
INVENTOR(S) : Kazuhiro Sugimoto It is certified that error appears in the above-identified patent and that said Letters Patent is hereby corrected as shown below:

In the Specification

In Column 1, Line 30, delete "WO 2015125023" and insert --WO 2015125823--, therefor.
In Column 1, Line 35, delete "past" and insert --part--, therefor.
In Column 1, Line 35, delete "B- type" and insert --n- type--, therefor.
In Column 1, Line 60, delete "hand" and insert --band--, therefor.
In Column 6, Line 51, delete "FIG.3" and insert --FIG.1--, therefor.
In Column 7, Line 39, after "characteristics" delete "-".
In Column 8, Line 13, delete "past" and insert --part--, therefor.
In Column 8, Line 13, delete "hand" and insert --band--, therefor.
In Column 10, Line 26, delete "part 32a" and insert --part 12a--, therefor.
In Column 10, Line 38, delete "easing" and insert --casing--, therefor.
In Column 13, Line 19, delete "past 12b" and insert --part 12b--, therefor.
In Column 14, Line 29, delete "Seeback" and insert --Seebeck--, therefor.
In Column 14, Line 38, delete "Seeback" and insert --Seebeck--, therefor.
In Column 14, Line 60, delete "allow" and insert --a flow--, therefor.
In Column 14, Line 60, after "illustrates", delete ",".
In Column 15, Line 17, delete "feces" and insert --faces--, therefor.
In Column 16, Line 24, delete "S304" and insert --S104--, therefor.
In Column 17, Line 2, after "specification", delete ",".
In Column 17, Line 3, delete "transducing" and insert --transducer--, therefor.
In Column 17, Line 11, after "thereof", insert --,--.
In Column 18, Line 49, delete "takes" and insert --taken--, therefor.
In Column 21, Line 30, delete "detested" and insert --detected--, therefor.
In Column 23, Line 50, after "processing", delete ";".
In Column 25, Line 18, delete "feces" and insert --faces--, therefor.
In Column 25, Line 53, after "T$_P$", delete "a t" and insert --at--, therefor.
In Column 25, Line 54, after "example," delete "pro vided" and insert --provided--, therefor.
In Column 29, Line 20, after "side", delete ",".
In Column 32, Line 64, after "If", insert --,--, therefor.

Signed and Sealed this
Seventh Day of January, 2020

Andrei Iancu
*Director of the United States Patent and Trademark Office*

CERTIFICATE OF CORRECTION (continued)
U.S. Pat. No. 10,454,011 B2

In Column 33, Line 66, delete "foe" and insert --the--, therefor.
In Column 34, Line 32, delete "fells" and insert --falls--, therefor.
In Column 34, Line 43, delete "32" and insert --12--, therefor.